United States Patent [19]

Matsumoto et al.

[11] Patent Number: 5,151,305
[45] Date of Patent: Sep. 29, 1992

[54] PROCESS FOR FORMING METAL DEPOSITED FILM CONTAINING ALUMINUM AS MAIN COMPONENT BY USE OF ALKYL ALUMINUM HYDRIDE

[75] Inventors: Shigeyuki Matsumoto, Atsugi; Osamu Ikeda, Yokohama, both of Japan

[73] Assignee: Canon Kabushiki Kaisha, Tokyo, Japan

[21] Appl. No.: 656,960

[22] Filed: Feb. 19, 1991

[30] Foreign Application Priority Data

| Feb. 19, 1990 | [JP] | Japan | 2-036194 |
| Feb. 19, 1990 | [JP] | Japan | 2-036195 |
| Feb. 19, 1990 | [JP] | Japan | 2-036196 |
| Feb. 19, 1990 | [JP] | Japan | 2-036197 |

[51] Int. Cl.$^5$ .............................. C23C 16/00
[52] U.S. Cl. .................. 427/252; 204/192.15; 427/124; 427/252.2; 427/255.7; 427/299
[58] Field of Search ............. 427/250, 251, 252, 124, 427/252.2, 252.7, 299; 204/192.15

[56] References Cited

U.S. PATENT DOCUMENTS

| 4,492,716 | 1/1985 | Yamazaki | 427/38 |
| 4,825,808 | 5/1989 | Takahashi et al. | 118/719 |
| 4,923,717 | 5/1990 | Gladfelter et al. | 427/252 |

FOREIGN PATENT DOCUMENTS

| 0420594 | 4/1991 | European Pat. Off. |
| 0425084 | 5/1991 | European Pat. Off. |
| 63-33569 | 2/1988 | Japan |
| 8606755 | 11/1986 | PCT Int'l Appl. |

OTHER PUBLICATIONS

R. A. Levy et al., "Characterization of LPCVD Aluminum for VLSI Processing", J. Electrochem. Soc., 131, 2175-82 (1984).

Primary Examiner—Bernard Pianalto
Attorney, Agent, or Firm—Fitzpatrick, Cella, Harper & Scinto

[57] ABSTRACT

A process for forming a metal film comprises the steps of arranging a substrate in a space for formation of the film, introducing an alkylaluminum hydride gas and hydrogen gas into the space and heating directly the substrate to form a metal film comprising aluminum as main component on the surface of the substrate.

12 Claims, 9 Drawing Sheets

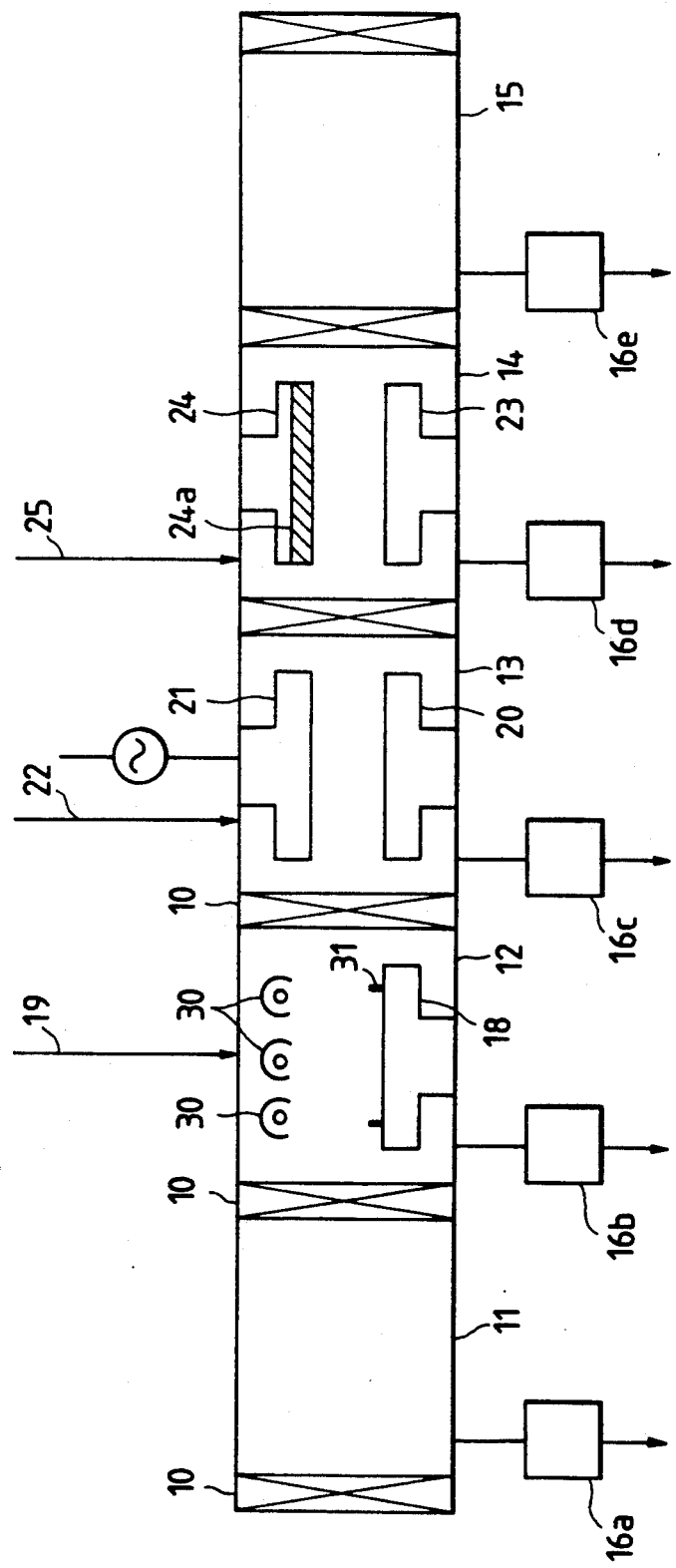

PROCESS FOR FORMING METAL DEPOSITED FILM CONTAINING ALUMINUM AS MAIN COMPONENT BY USE OF ALKYL ALUMINUM HYDRIDE

BACKGROUND OF THE INVENTION

1. Field of the Invention

This invention relates to a metal deposited film forming method, particularly to a process for forming metal deposited film which can be preferably applied to wiring of semiconductor integrated circuit device, etc.

2. Related Background Art

For electrode or wiring in electronic device or integrated circuit by use of semiconductor of the prior art, aluminum (Al) or aluminum containing silicon (Al-Si), etc. has been primarily used. Here, Al is inexpensive, has high electroconductivity, and also a dense oxide film is formed on the surface, whereby it has many advantages such that it can be chemically protected internally to be stabilized, that adhesiveness with Si is good, etc.

Whereas, integration degree of integrated circuit such as LSI, etc. is increased, and fine formation of wiring and multi-layer wiring are particularly required in recent years. Thus, more stringent demands not found to date are presented for wiring. For example, in dynamic RAM such as 4 Mbit or 16 Mbit, etc., the aspect ratio (depth of opening diameter of opening) of openings (via-holes) in which a metal such as Al, etc. must be deposited is 1.0 or more. The diameter itself of the opening is 1 μm or less, and a technique capable of depositing Al as well in openings with larger aspect ratio is required.

Besides, to be commercially successful concerning semiconductor integrated circuit devices, the technique must enable bulk production at low cost.

There have been known in the art the sputtering method, the gas phase method such as the CVD method by use of trimethylaluminum, etc. as a method of forming metal film such as Al film, etc. Above all, the thermal CVD (chemical vapor deposition) method has been variously studied. For example, there has been employed the method in which an organic aluminum dispersed in a carrier gas is transported onto a heated substrate, and the gas molecules are thermally decomposed on the substrate to form a film. For example, as described in "Journal of Electrochemical Society Vol. 131, p. 2175 (1984)", by use of triisobutyl aluminum (i-$C_4H_9$)$_3$Al (TIBA), film formation is carried out at a film formation temperature of 260° C., a reaction tube pressure of 0.5 Torr, whereby a film of 3.4 μ cm is formed.

However, according to this method, the surface flatness of Al is poor, and no film of good quality is obtained in view of step coverage, electromigration, etc. Besides, the Al within openings do not become dense.

Japanese Patent Laid-open No. 63-33569 discloses a method for film formation by heating an organic aluminum in the vicinity of the substrate. According to this method, Al can be deposited according to the CVD method selectively only on the metal or semiconductor surface of the substrate where the naturally oxidized film on the surface has been removed. It is further possible to deposit Al on the oxide film by the sputtering method after embedding of the openings.

However, according to this method, since the surface smoothness of Al within an opening is a major premise it is not sufficient, as electrical contact of the interface between the Al film according to the CVD method and the Al film according to the sputtering method is poor in bringing about an increase in resistivity.

As an example of a modification of this method, the pre-text of "2nd Symposium of Electrochemical Society, Branch of Japan (Jul. 7th, 1989), on p. 75, described the double wall CVD method. This method can grow selectively Al only on a metal or semiconductor by use of TIBA gas. However, it is difficult to precisely control the difference between the gas temperature and the substrate surface temperature and the bomb and the wiring must also be heated and, thus as these factors add to the drawback that the apparatus constitution becomes complicated.

More specifically, if these are to be controlled, the apparatus for metal deposited film formation is complicated and it cannot be made as the sheet treatment type in which deposition can be effected in only one sheet of wafer by one deposition process. Besides, only a film which can never be said to be of good quality can be obtained at a deposition speed of 500 Å/min. at the highest, whereby it is impossible to realize the output necessary for bulk production. Moreover, even the film obtained according to this method cannot become a uniform continuous film unless made to have some thickness. Thus, this method proved to be unsatisfactory and unsuitable for bulk production, because reproducibility was poor for such reasons that flatness of the film is poor, that selectivity of Al selective growth cannot be maintained for so long time, etc.

Further, when one metal film forming apparatus is employed, various gases for film formation or gases for cleaning of the chamber, etc. are introduced into a reaction chamber for the purpose of film formation actuation or maintenance of the apparatus to carry out the desired treatments. When film formation is continued while performing such treatments, even in the CVD method with little containment of carbon, etc. from an organic aluminum starting material, there will ensue the fear that various impurities other than carbon may be entrained into the interface, etc. Such a problem may suddenly cause a lower yield in bulk production of semiconductor devices.

SUMMARY OF THE INVENTION

As described above, according to the CVD method of the prior art, none of improvement of deposition speed and improvement of output which are indispensable for bulk production of semiconductor integrated circuit devices at low cost could be desired, and also there was the problem that no selective growth of Al of good quality could be successfully done. Even if selective growth of good Al could be obtained, problems remained with respect to flatness, purity and step coverage, embedding of dense Al within contact holes, etc., whereby reproducibility was poor. Thus, there has been much room for improvement of higher integration.

An object of the present invention is to solve the technical problems as described above and provide a metal film forming method by which a metal film can be obtained with good reproducibility at high deposition speed and high output even without use of a complicated and expensive deposited film formation apparatus.

Another object of the present invention is to provide a metal film forming method which can form a metal film within openings with a large aspect ratio.

Still another object of the present invention is to provide a metal film forming method which can form a metal film excellent as a electrode and a wiring material of a semiconductor device due to improving the contact between the metal excellent in electroconductivity and flatness deposited first within the openings and the metal film deposited thereafter, thus having low resistivity and being strong to electromigration, by depositing a metal of good quality within the openings according to the film forming method excellent in selectivity, and then depositing the metal on the whole surface including the insulting film surface according to the non-selective film forming method.

Still another object of the present invention is to provide a metal film forming method which is substantially free from entrainment of an impurity even after the metal film forming apparatus has been used repeatedly for a long term.

For accomplishing such objects, the present invention comprises the steps of arranging a substrate in a space for formation of the film, introducing an alkylaluminum hydride gas and hydrogen gas into the space and heating directly the substate to form a metal film comprising aluminum as main component on the surface of the substrate.

Of course, during film formation, by introducing a gas containing element such as Si, etc., if necessary, in combination, a metal film comprising aluminum as main component such as Al-si, etc. can be formed.

In the present invention, by heating directly the substrate during selective deposition of aluminum, a metal film with excellent film characteristics can be formed at higher deposition speed than expected.

According to the present invention, since the direct heating method by lamp, etc. is utilized, the deposition speed can be improved by promoting supply of hydrogen atoms onto the electron-donative surface while maintaining surely selectivity.

Improvement of deposition speed not only enhances output, but also brings about the effect of preventing entrainment of impurities even under bad conditions where impurities are readily entrained into the metal film. Therefore, both film quality and throughput can be improved at once, whereby remarkable effects can be exhibited in the field of preparing semiconductor devices.

The problem of entrainment of impurities can be also improved by utilizing a metal film forming apparatus having a so called multi-chamber, in which the formation step of the Al film is divided into two steps, a selective deposition step and a non-selective deposition step, and the reaction chambers of above-mentioned two steps are jointed mutually together, to carry out continuously the above two steps.

For accomplishing the objects as described above, the present invention comprises the steps of arranging a substrate in a first film forming chamber, introducing an alkylaluminum hydride gas and hydrogen gas into the first film forming chamber, heating the substrate to form an aluminum film on the surface of the substrate, and moving to arrange the substrate under shielding of outer air into a second film forming chamber provided adjacent to the first film forming chamber so as to be capable of being continuously shielded from outer air and forming a metal film on the substrate according to the gas phase method.

The Al deposited selectively within contact holes becomes a monocrystalline material of good quality to form a dense film with excellent surface flatness. Further, by moving the substrate onto the film continuously through the film forming chamber without exposure to outer air, selective deposition/non-selective deposition can be carried out continuously. Based on the surface reaction at a low temperature of DMAH and $H_2$ gases when performing selective deposition, Al is selectively deposited within contact holes. Since this Al is an Al film of good quality with very excellent selectivity, for application as the wiring material of a semiconductor device, a metal film must be formed non-selectively on the insulating layer, thereby enabling a multi-layer wiring. Here, the Al film deposited within contact holes has been found to be a single crystal with excellent surface flatness. With an insulating film surface including such monocrystalline Al surface, even when a metal film such as Al, etc. may be formed according to the sputtering or CVD method, good connection between the Al film formed thus and the Al film selectively deposited within contact holes can be maintained, whereby an Al film with small specific resistance can be obtained.

Also, for accomplishing the objects as mentioned above, the present invention comprises the steps of arranging a substrate in a first film forming chamber, introducing an alkylaluminum hydride gas, a gas containing silicon element and hydrogen gas into the first film forming chamber, heating the substrate to deposit an aluminum-silicon film on the surface of the substrate, moving to arrange the substrate under shielding of outer air into a second film forming chamber provided adjacent to the first film forming chamber so as to be capable of being continuously shielded from outer air and forming a metal film on the substrate according to the gas phase method.

The Al-Si deposited selectively within contact holes becomes a monocrystalline material of good quality to become a dense film with excellent surface flatness. Further, by moving the substrate continuously within the film forming chamber without exposure to outer air, selective deposition/non-selective deposition can be carried out continuously. Based on the surface reaction at a low temperature of DMAH, a gas containing silicon and $H_2$ gas when performing selective deposition, Al-Si is selectively deposited within contact holes. Since the Al-Si is an Al-Si film of good quality with very excellent selectivity, for application as the wiring material of a semiconductor device, a metal film must be formed non-selectively on the insulating layer, thereby enabling a multi-layer wiring. Here, the Al-Si film deposited within contact holes has been found to be a single crystal with excellent surface flatness. With respect to an insulating film surface including such monocrystalline Al-Si surface, even when a metal film such as Al, etc. may be formed according to the sputtering or CVD method, good connection can be maintained between the metal film formed and the Al film selectively deposited within contact holes, whereby an Al film with small specific resistance can be obtained.

BRIEF DESCRIPTION OF THE DRAWINGS

FIG. 4 shows a schematic view of the steps aligned successively;

FIG. 5 is a schematic plan view of the constitution;

FIG. 6 is the same plan view of the constitution as of FIG. 5 and is added with the movement order by arrowheads;

FIG. 7 is schematic view showing another example of the preferable metal film continuous forming apparatus for practicing the present invention;

DETAILED DESCTIPTION OF THE PREFERRED EMBODIMENTS

Figure 1:
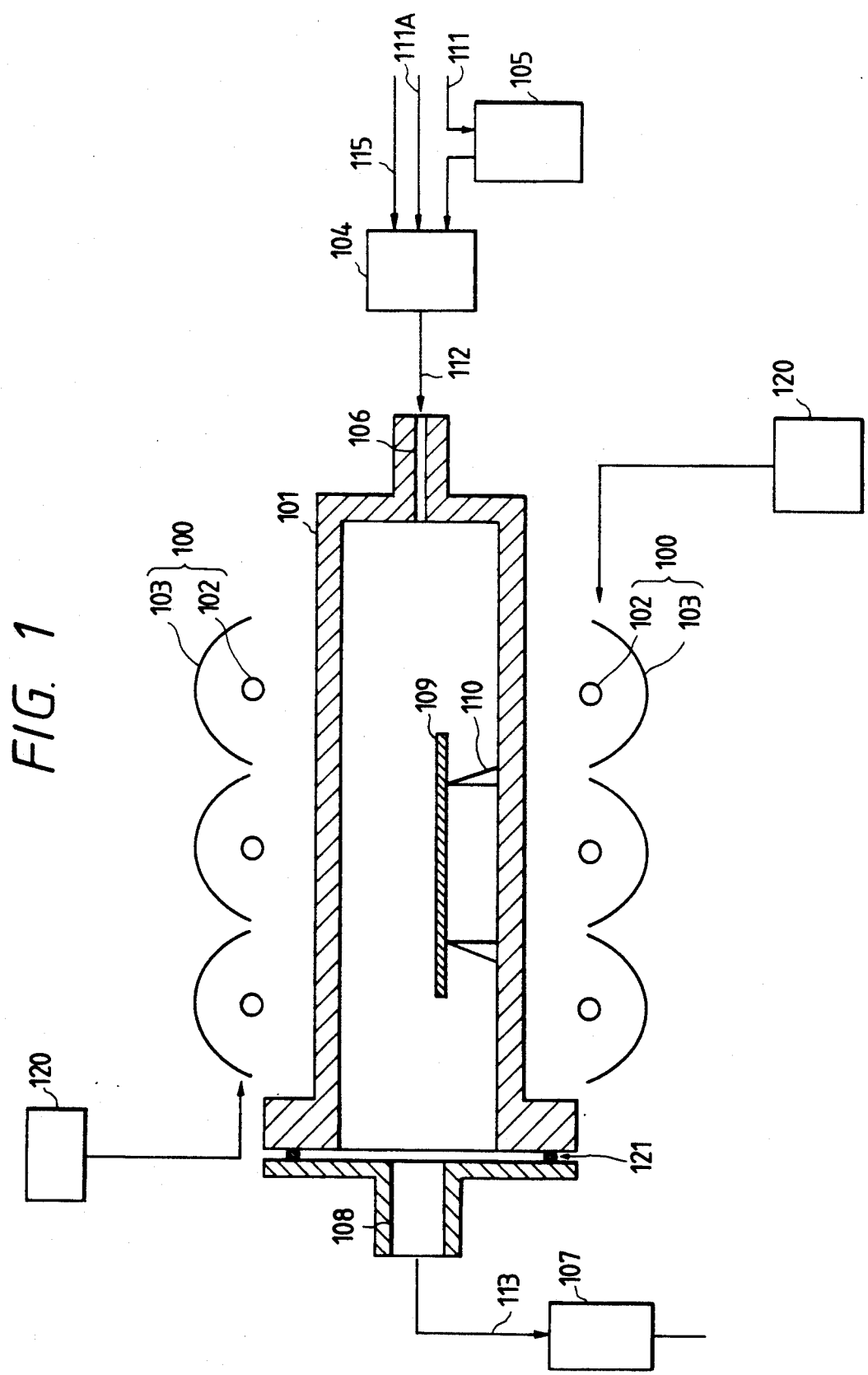
FIG. 1 is a schematic view showing an example of the preferable metal film forming apparatus for practicing the present invention.

Before giving a detailed description of the present invention, first the film forming method (Al-CVD method) of a metal film (including pure Al) comprising Al as main component preferable for the present invention is described below.

This method is a method suitable for embedding of a metallic material into, for example, fine and deep openings (contact holes, throughholes) with an aspect ratio of 1 or more, and is also a deposition method excellent in selectivity.

The metal film formed by this method is extremely excellent in crystallinity such as formation of a monocrystalline Al and contains little carbon etc.

This method is a method of forming a deposition film through the surface reaction on an electron-donative substrate by use of an alkylaluminum hydride gas and hydrogen gas. Particularly, by use of an alkylaluminum hydride containing methyl groups such as monomethylaluminum hydride (MMAH) or dimethylaluminum hydride (DMAH) as starting gas and $H_2$ gas as reaction gas, and by heating of the substrate surface under a gas mixture of these, an Al film of good quality can be deposited.

By applying the CVD method to the substrate in which the electron-donative surface portion and non-electron-donative portion co-exist, a single crystal of Al is formed under good selectivity only on the electron-donative substrate surface portion.

An electron-donative material refers to a material having the surface where the chemical reaction is promoted by give-and-take of electrons with the starting gas molecules attached on the substrate surface, due to the presence of free electrons within the substrate or intentional formation of free electrons. For example, metals and semiconductors generally correspond to this. Also, one having a thin oxide film present on the metal or semiconductor surface undergoes the chemical reaction through give-and-take between the substrate and the attached starting material molecules, and therefore includes in the electron-donative material of the present invention.

Specific examples of electron-donative materials may include binary system, ternary system or more multiple system III–V group compound semiconductors comprising the combination of Ga, In, Al, etc. as the group III element and P, As, N, etc. as the group V element; semiconductor materials of P-type, I-type, N-type, etc. such as monocrystalline silicon, amorphous silicon, etc; the following metals, alloys, silicides, etc., for example, tungsten, molybdenum, tantalum, copper, titanium, aluminum, titanium-aluminum, titanium nitride, aluminum-silicon-copper, aluminum palladium, tungsten silicide, titanium silicide, aluminum silicide, molybdenum silicide, tantalum silicide, etc.

On the other hand, as the material for forming the surface where Al or Al-Si is not selectively deposited, namely the non-electron-donative material, there may be exemplified glasses, oxide films, thermally nitrided films such as silicon oxide, BSG, PSG, BPSG, etc. formed by thermal oxidation, CVD, etc. and silicon nitride films formed by the plasma CVD method, the reduced pressure CVD method, the ECR-CVD method, etc.

According to the Al-CVD method, a metal film containing a modifying element and comprising Al as main component can also be deposited selectively, and its film quality also exhibits excellent characteristics.

For example, in addition to an alkylaluminum hydride gas and hydrogen, a gas containing Si element such as $SiH_4$, $Si_2H_6$, $Si_3H_8$, $Si(CH_3)_4$, $SiCl_4$, $SiH_2Cl_2$, $SiHCl_3$, etc., a gas containing Ti element such as $TiCl_4$, $TiBr_4$, $Ti(CH_3)_4$, etc.

a gas containing Cu element such as copper bisacetylacetonate $Cu(C_5H_7O_2)_2$, copper bisdipivaloylmethanite $Cu(C_{11}H_{19}O_2)_2$, copper bishexafluoroacetylacetonate $Cu(C_5HF_6O_2)_2$, etc.

may be conveniently combined and introduced to form a gas mixture atmosphere, thereby depositing selectively an electroconductive material such as Al-Si, Al-Ti, Al-Cu, Al-Si-Ti, Al-Si-Cu, etc. to form an electrode.

Also, since the above-described Al-CVD method is a film forming method excellent in selectivity and also gives good surface characteristics of the film deposited, by applying a non-selective film forming method for the next deposition step to form a metal film of Al or comprising Al as main component also on the Al film selectively deposited as described above and $SiO_2$, etc. as the insulating film, a suitable metal film of high general purpose availability as the wiring for semiconductor device can be obtained. The method is described later as a preferred embodiment of the present invention.

Such metal film is specifically described below. That is, it is a combination of Al, Al-Si, Al-Ti, Al-Cu, Al-Si-Ti, Al-Si-Cu selectively deposited with Al, Al-Si, Al-Ti, Al-Cu, Al-Si-Ti, Al-Si-Cu non-selectively deposited. As the film forming method for non-selective deposition, there are CVD methods other than the above-mentioned Al-CVD method, sputtering methods, etc.

As the metal film to be deposited non-selectively, a metal comprising, W, Mo, etc. as a main component may be employed.

Now, the present invention is described by referring to specific embodiments, but the present invention is not limited to the embodiments as described below, but includes various modified embodiments, which may have constitutions capable of accomplishing the object of the present invention.

In one embodiment of the present invention a deposited film of a metal is formed by directly heating the substrate surface by a lamp, etc. when forming an Al film on a substrate by use of at least two kinds of an alkylaluminum hydride gas and hydrogen gas.

The metal film comprising Al as a main component which can be formed according to the present invention may include such combinations as pure Al selectively deposited and pure Al non-selectively deposited, pure Al and Al-Sr, pure Al and Al-Cu, Al and Al-Si-Cu, Al and Al-Ti, Al and Al-Si-Ti, etc.

Particularly, monomethylaluminum hydride (MMAH) and/or dimethylaluminum hydride (DMAH) as the starting gas is used and $H_2$ gas as the reaction gas is used, and by heating (lamp heating) directly the substrate surface under a mixture of these gases, an Al film of good quality can be formed at a high deposition speed.

Thus, instead of resistance heating of the substrate in order to hold at 260° C. to 440° C. which is preferable as the substrate surface temperature during Al film formation, the substrate surface is directly heated by a lamp, whereby a film of good quality can be obtained at a high deposition speed of 3000 to 5000 Å/min.

The above explanation has been made about an embodiment of depositing pure Al as the metal film composing Al as main component by use only of a gas of an organic aluminum as the starting gas. In the present invention, it is also possible to form a metal film having excellent film characteristics at high deposition speed by heating directly the substrate during selective deposition of aluminum containing a modifying element such as aluminum-silicon (Al-Si) on the substrate.

In this embodiment of the present invention, a deposited film of a metal is formed by directly heating the substrate surface by a lamp, etc. when forming an Al film on a substrate by use of an alkylaluminum hydride gas, a gas containing silicon element and hydrogen gas.

The metal film which can be formed according to the present invention may include combinations of a metal comprising aluminum as main component and containing a modifying element such as Al-Si, etc., selectively deposited and Al-Si non-selectively deposited, Al-Si and Al-Cu, Al-Si and Al-Si-Cu, Al-Si and Al-Ti, Al-Si and Al-Si-Ti, etc.

Particularly, monomethylaluminum hydride (MMAH) as described above and/or dimethylaluminum hydride (DMAH) and a gas containing a modifying element such as silicon, etc. are used as the starting gases and $H_2$ gas as the reaction gas is used, and by heating directly the substrate surface under a mixture of these gases, a metal film comprising Al as main component of good quality can be formed at a high deposition speed.

Thus, also during formation of Al-Si film, in order to hold at 260° C. to 440° C. which is preferable as the substrate surface temperature, instead of resistance heating of the substrate, the substrate surface is directly heated by a lamp, whereby a film of good quality can be obtained at a high deposition speed of 3000 to 5000 Å/min.

DESCRIPTION OF THE METAL FILM FORMING APPARATUS (1)

First, as a preferably metal film forming apparatus to which the present invention is applied, an embodiment employing the direct heating system by a lamp is to be described.

FIG. 1 shows a preferably metal film forming apparatus to which the present invention is applied.

The heating means 100 consists of a plurality of combinations of the halogen lamp 102 and the reflection mirror 103 provided on the front side and the back side of the substrate 109, and by controlling the current supplied to the lamp by the controller 120 connected to a power source not shown, the temperature of the substrate can be set as desired.

The substrate 109 on which the metal film is to be formed is mounted on the substrate holder 110 within the reaction chamber 101 which is transparent and insulating made of molten quartz, etc. The feeding system of gas includes the mixer 104 and the bubbler 105, further including the gas feeding line having the hydrogen feeding pipe 111 for bubbling which is the first gasline communicated to the mixer 104 through the bubbler 105 housing DMAH, the hydrogen feeding line 111A which is the second gasline communicated to the mixer 104, and the gas introducing line 112 for introducing DMAH gas and hydrogen gas through the gas introducing hole 106 into the reaction chamber 101. In addition, 115 is the gas introducing line to be used when introducing other gases. The evacuation system 107 has an evacuation pump, and includes an evacuation line 113 communicated to the evacuation hole 108.

By use of this film forming apparatus, the substrate surface temperature can be stabilized to a desired temperature by heating for 5 seconds or less. The constitution of this apparatus also makes it possible to obtain high throughput to the exent that 15 to 30 sheets of 5 inch wafer can be treated per one hour.

As the direct heating means for performing direct heating, light sources such as halogen lamps, xenon lamps, etc. may be included.

More specifically, it is not a means as in resistance heating by which the substrate surface is heated through transmission of the heat transmitted through the stage mounting the substrate thereon from the back surface to the front surface, but a means such that the energy from the heating means is converted directly on the substrate surface to effect heating. It should be noted that this is different from the optical CVD method in which optical excitation is effected by utilizing UV-ray.

DESCRIPTION OF METAL FORMING METHOD (1)

Next, by referrring to FIG. 2, the metal film forming method to which the present invention can be preferably applied is described in detail.

A substrate to be deposited on which an insulating film 2 having openings (VH1, VH2) of various diameters is formed on a substrate 1 having an electron-donative surface and comprising a semiconductor or conductor material is prepared. Here, the surface of the insulating film 2 is the non-electron-donative surface (FIG. 2 A).

Figure 2A:
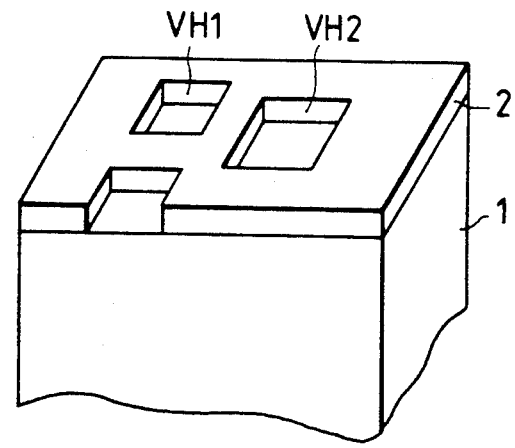
FIG. 2 is a schematic view for illustration of the metal film forming method according to the present invention.
Figure 2B:
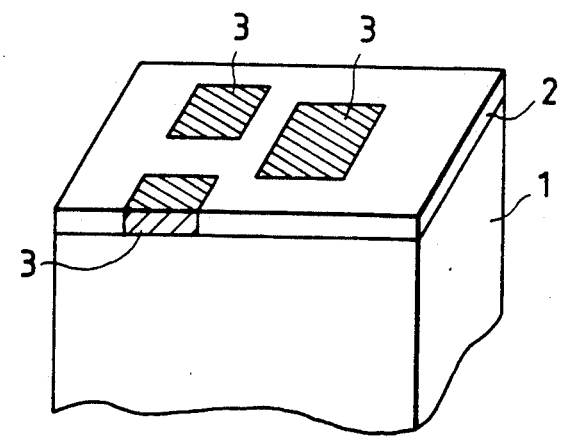

Next, according to the CVD method utilizing an alkylaluminum hydride and hydrogen, a metal film comprising Al as a main component is formed. For that purpose, the substrate is arranged within the reaction chamber 101, and after reducing the pressure in the reaction chamber, a gas mixture of alkylaluminum hydride and hydrogen is introduced into the reaction chamber. By lighting a lamp and maintaining the temperature of the substrate surface at from 260° C. to 440° C., more preferably from 270° C. to 440° C., Al is selectively deposited within the openings. On the basis of the deposition speed determined previously by the experiments, Al is deposited to almost the same height as the insulating film surface (FIG. 2B).

Next, for forming the wiring for semiconductor device, Al is deposited on the whole surface. For that purpose, the substrate is taken out from the reaction chamber in FIG. 1, placed into the reaction chamber of another deposition film forming apparatus, and Al is deposited according to the sputtering method or the CVD method well known in the art (FIG. 2 C).

Mechanism of Al deposition may be as follows, as presently understood.

Figure 8A:
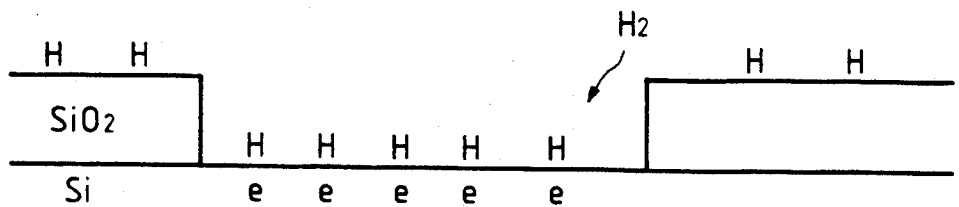
FIG. 8 is a schematic view showing the manner of selective deposition of Al.
Figure 8B:
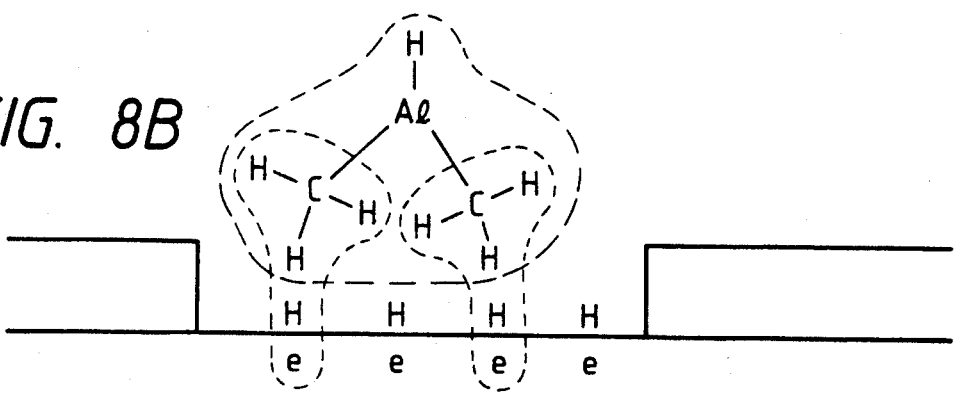
Figure 8C:
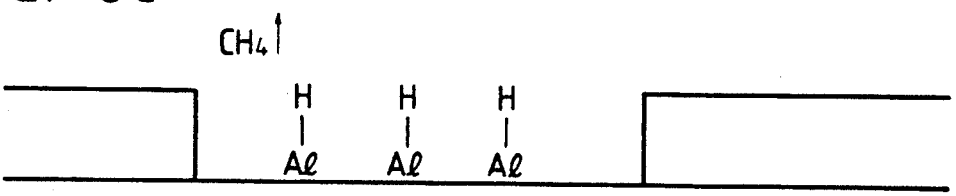
Figure 8D:
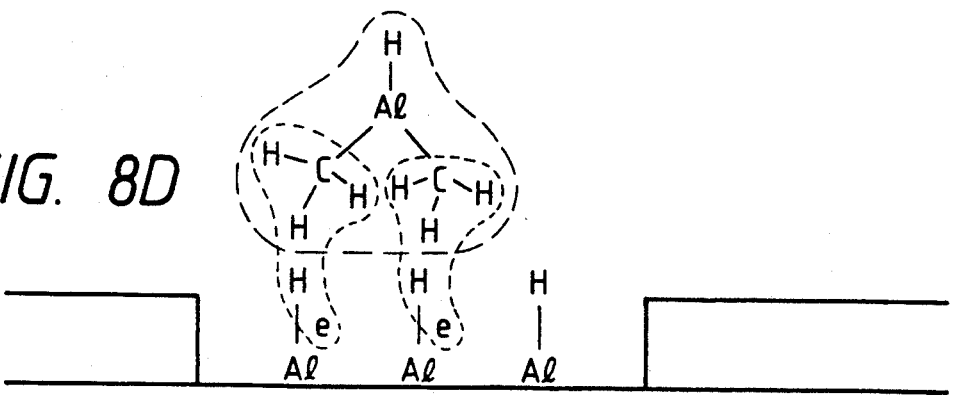

When DMAH with methyl groups is directed toward the substrate side under the state where hydrogen atoms are attached on an electron-donative substrate, namely a substrate having electrons (FIG. 8 A), the electrons of the substrate will cut one bond between Al and methyl group (FIGS. 8B and 8C).

The reaction at this time is as follows:

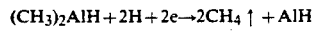

Further, the reaction proceeds similarly for the hydrogen atoms remaining on the Al deposited having free electrons (FIG. 8 D). Here, when hydrogen atoms are deficient, hydrogen molecules of the reaction gas will be decomposed to be supplied as hydrogen atoms. On the surface of the non-electron-donative surface, there is no electron and therefore the reaction as described above will not proceed and no Al will be deposited.

Thus, for obtaining high deposition speed, it is important to promote the dissociation-adsorption reaction in which hydrogen molecules are decomposed into hydrogen atoms to have them adsorbed onto the electron-donative surface. Direct heating plays this role to accelerate selective deposition.

Figure 3:
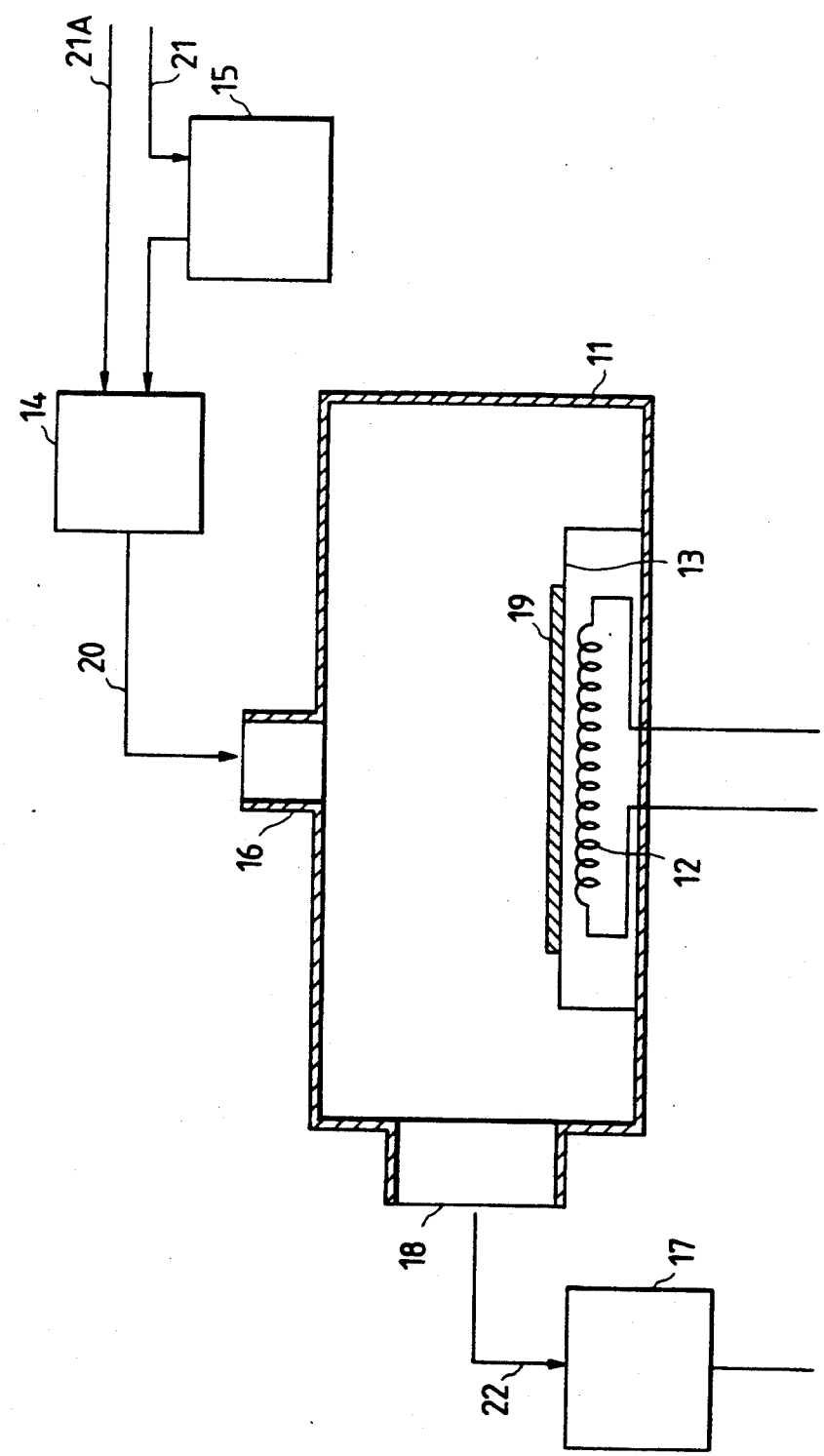
FIG. 3 is a schematic view showing an example of the metal film forming apparatus suitable for comparison with the present invention.

Comparison has been made between the Al film obtained by direct heating with a lamp, etc. by use of DMAH as the alkylaluminum hydride and $H_2$ and the Al film obtained by heating the substrate to 260° C. with resistance heating by means of the device shown in FIG. 3.

The Al film obtained by the resistance heating method was found to contain no carbon and have a good resistivity, but the deposition speed of the film was 800 Å/min. at the maximum, which could never be said to be high. Accordingly, improvement of the deposition speed was attempted by elevating the substrate temperature, but samples with worsened surface morphology, lowered resistivity or no selectivity were generated. Thus, the present inventors, found that there ensues the problem with respect to reproducibility by merely elevating the substrate temperature.

The present inventors have also attempted to elaborate enhancement of deposition speed by way of increasing the gas flow rate of DMAH. However, also in this case, samples with worsened surface morphology were observed, whereby it has been found that a problem also remains with respect to reproducibility according to this method.

In contrast, the pure Al deposited within the openings according to the method as described above assumes a monocrystalline structure, having excellent characteristics such as:

(1) reduced generation probability of hillock;

(2) reduced generation probability of alloy spike.

The method as described above is a deposition method excellent in selectivity and fine working, and by applying a non-selective deposition method as the next deposition step, for the purpose of comparison with direct heating by a lamp, etc. similarly as in the case of pure Al as described above, the present inventors have also attempted to form an Al-Si film by use of DMAH as the alkylaluminum hydride, a gas containing silicon element and $H_2$ by heating the substrate to 260° C. with resistance heating.

The Al-Si film obtained according to this method contained no carbon and had a good resistivity, but the deposition speed of the film was 800 Å/min. at the maximum, which could never be said to be high. Accordingly, improvement of the deposition speed was attempted by elevating the substrate temperature, but samples with worsened surface morphology, lowered resistivity or no selectivity were generated.

In contrast, the Al-Si film deposited within the openings by the direct heating system exhibited a good crystalline structure, with low generation probability of hillock and also low generation probability of alloy spike.

Since the method described above is a deposition method excellent in selectivity, by forming a metal film comprising Al-Si as main component also on the Al-Si film selectively deposited and the $SiO_2$ which is an insulating film as described above by applying a non-selective deposition method as the next deposition method, a metal film suitable for the wiring of a semiconductor device can be obtained.

The gas containing silicon element is introduced through the feeding pipe 115 which is the third gasline into the mixer 104.

By use of the film forming apparatus, similarly as in the case of pure Al, the substrate surface temperature can be stabilized to a desired temperature by heating for 5 seconds or less. Also, there can be obtained by this apparatus a high throughput to the extent that 15 to 30 sheets of 5 inch wafer can be treated per one hour.

In still another embodiment of the present invention, by use of a metal film forming apparatus having a multi-chamber, first a metal film comprising Al as main component is formed selectively on a substrate according to the CVD method by use of alkylaluminum hydride and hydrogen in a first film forming chamber, and then the substrate is transferred to a second film forming chamber without exposure to outer air to form a metal film on the whole surface of the substrate.

Specific examples of the metal film formable according to the present invention utilizing the metal film forming apparatus having a multi-chamber may include combinations of pure Al selectively deposited and pure Al non-selectively deposited, pure Al and Al-Si, pure Al and Al-Cu, pure Al and Al-Si-Cu, pure Al and Al-Ti, etc.

The surface temperature of the substrate during Al selective deposition may be preferably from the decomposition temperature of the alkylaluminum hydride or higher to lower 450° C., more preferably from 260° C. to 440° C.

Particularly, by using monomethylaluminum hydride (MMAH) and/or dimethylaluminum hydride (DMAH) as the starting gas and $H_2$ gas as the reaction gas, and heating the substrate surface under a mixture of these gases, an Al film of good quality can be formed at high deposition speed.

In this case, by holding the substrate surface temperature during Al film formation at 260° to 440° C. which is more preferable, a film of good quality can be obtained at a higher speed of 3000 to 5000 Å/min. than in the case of resistance heating.

Further, specific examples of the metal film formable according to the present invention may include such combinations of a metal comprising Al a main component and containing a modifying element such as Al-Si, etc. and Al non-selectively deposited, Al-Si and Al-Si, Al-Si and Al-Cu, Al-Si and Al-Si-Cu, Al-Si and Al-Ti, Al-Si and Al-Si-Ti, etc.

The surface temperature of the substrate during Al-Si selective deposition may be preferably from the decomposition temperature of the alkylaluminum hydride or higher to lower than 450° C., more preferably from 260° C. to 440° C.

Particularly, by using monomethylaluminum hydride (MMAH) and/or dimethylaluminum hydride (DMAH) as the starting gas, $Si_2H_6$ as the gas containing a modifying element, and $H_2$ gas as the reaction gas, and by lamp heating the substrate surface under a mixture of these gases, an Al-Si film of good quality can be formed at high deposition speed.

Also in this case, by holding the substrate surface temperature during Al film formation at 260° to 440° C. which is more preferable, a film of good quality can be obtained at a higher speed of 3000 to 5000 Å/min. than in the case of resistance heating.

DESCRIPTION OF METAL FILM FORMING APPARATUS (2)

As another embodiment of the preferable metal film forming apparatus to which the present invention is applied, the apparatus having a multi-chamber is described.

Figure 4:
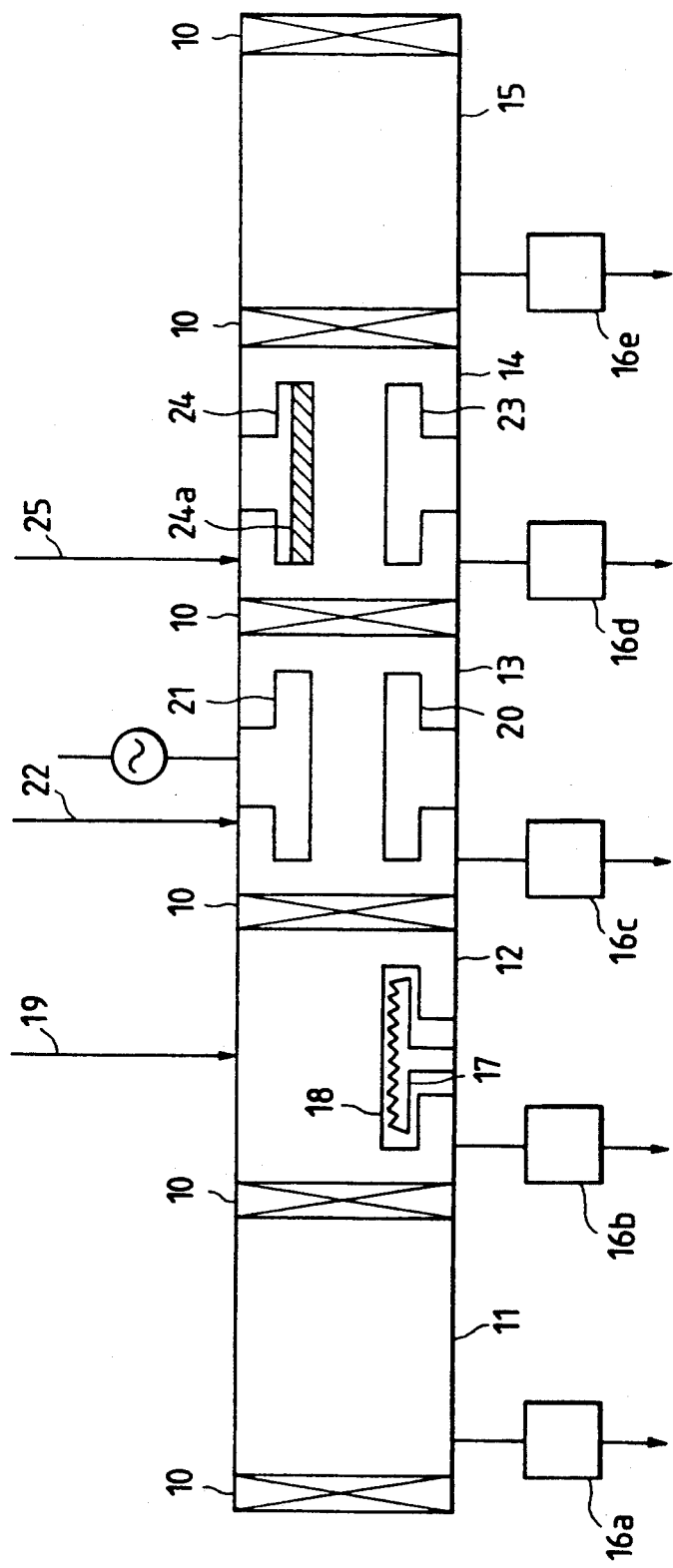
FIG. 4 through FIG. 6 show an example of the preferable metal film continuous forming apparatus for practicing the present invention.
Figure 5:
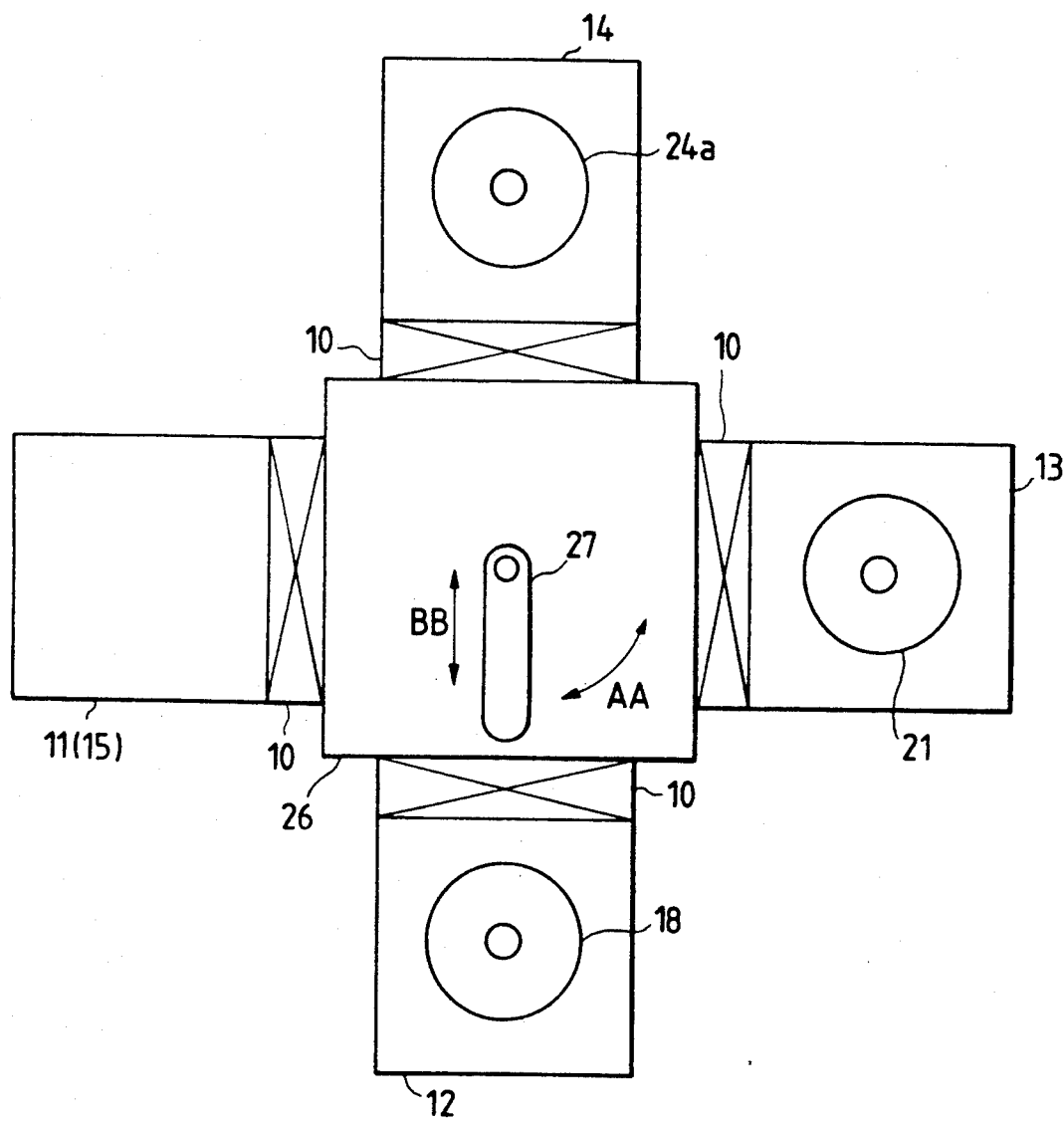
Figure 6:
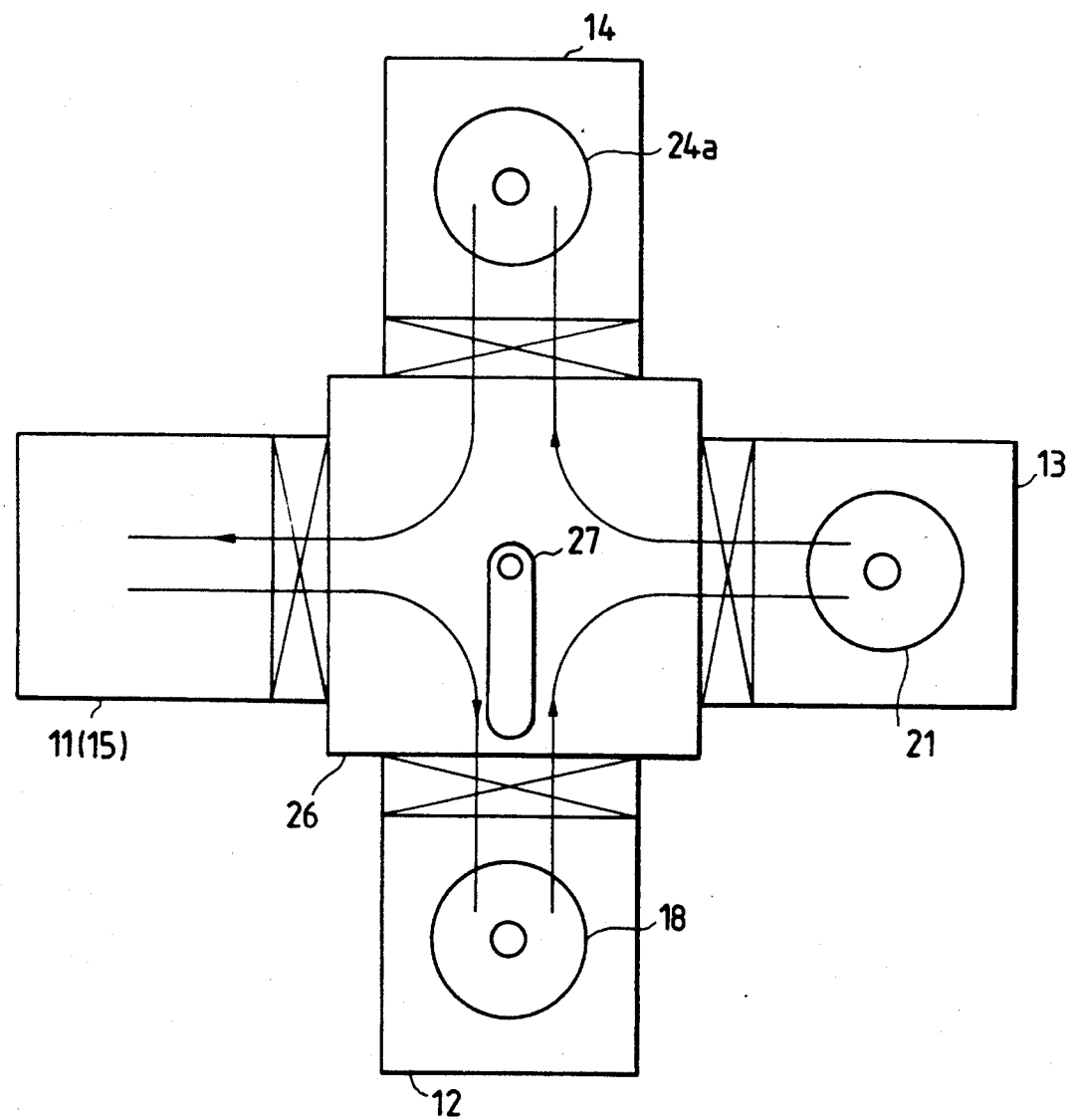

FIG. 4 through FIG. 6 show a metal film continuous forming apparatus to which the present invention can be preferably applied.

The metal film continuous forming apparatus, as shown in FIG. 4, consists of a load lock chamber 11, a CVD reaction chamber (first film forming chamber) 12, an Rf etching chamber 13, a sputtering chamber (second film forming chamber), a load lock chamber 15 which are continuously juxtaposed communicatably to one another by gate valves 10 under continuous shielding from outer air, and the respective chambers are constituted so that they can be evacuated or reduced in pressure by the evacuation systems 16a to 16e, respectively. The above-mentioned load lock chamber 11 is a chamber for replacing the substrate atmosphere before deposition treatment with $H_2$ atmosphere after evacuation for improvement of throughput characteristic. The next CVD reaction chamber 12 is a chamber for selective deposition on the substrate under normal pressure or reduced pressure provided internally with a substrate holder 18 having a resistance heating body (heated to from 200° to 430° C.) 17 and is also constituted so that the gas for CVD may be introduced through the gas introducing line 19 for CVD. The next Rf etching chamber 13 is a chamber for performing cleaning (etching) of the substrate surface after the selective deposition under Ar atmosphere, which is provided internally with the substrate holder 20 to be heated to from 100° C. to 250° C. and the electrode line 21 for Rf etching, and also connected to the Ar gas feeding line 22. The next sputtering chamber 14 is a chamber for depositing non-selectively a metal film by sputtering onto the substrate surface under Ar atmosphere, and provided internally with the substrate holder 23 to be heated to from 200° C. to 250° C. and the target electrode 24 for mounting the sputter target material 24a thereon, and also connected to the Ar gas feeding line 25. The last load lock chamber 15 is a control chamber before taking out the substrate after completion of the metal film deposition into outer air, and constituted so as to replace the atmosphere with $N_2$.

In FIG. 4, the metal film continuous forming apparatus of the above constitution is shown in time series on the basis of the steps, but practically, as shown in FIG. 5, the structure is such that the above-described load lock chamber 11, CVD reaction chamber 12, Rf etching chamber 13, sputtering chamber 14 and load lock chamber 15 are mutually linked together with the conveying chamber 26 as the relay chamber. In this constitution, the load lock chamber 11 also functions as the load lock chamber 15. In the above-mentioned conveying chamber 26 shielded from the air, as shown in the Figure, an arm (conveying means) 27 rotatable reversibly in the AA direction and also stretchable in the BB direction is provided. By means of the arm 27, as shown by the arrowhead in FIG. 6, the substrate can be moved successively according to the steps from the load lock chamber 11 to the CVD chamber 12, the Rf etching chamber 13, the sputtering chamber 14, the load lock chamber 15 continuously without exposure to the outer air.

FIG. 7 shows another constitutional example of the metal film continuous forming apparatus, and the same members as in FIG. 4 are affixed with the same symbols. The difference of the apparatus in FIG. 7 from that in FIG. 4 resides in heating directly the substrate surface by use of a halogen lamp 30. Thus, by direct heating, the deposition speed can be further improved. For effecting direct heating, the substrate holder 12 has a nail 31 arranged for holding the substrate under floated state.

In the heating systems applicable to this method, as the method of direct heating (which heats the substate itself by transmission of the energy from the heating means), for example, lamp heating by halogen lamp, xenon lamp, etc. may be included. In this connection, as the resistance heating, there may be mentioned heating members, etc. provided on the substrate supporting members arranged in the space for deposited film formation for supporting the substrate to have deposited film formed thereon.

In the case of depositing an aluminum film containing a modifying element, the metal film forming apparatus as shown in FIG. 4 to FIG. 7 can be also used as described above.

That is, a gasline for introducing the gas other than the gas of organic aluminum may be additionally provided.

In the following, the gas feeding system preferably used for the metal film forming apparatus as described above is described by referring to FIG. 9.

The gas introducing line 312 of the reaction chamber 301 is connected to the mixer 304. A plurality of lines for introducing gases are connected to the mixer 304, one of them is the line is 311 for introducing hydrogen gas and connected to the cooler 320. The other line is the starting gas introducing line 312 and connected to the bubbler 305. The bubbler is connected to the carrier gas introducing line 313 for bubbling of liquid starting material and connected to the cooler 320 similarly as the line 311.

Further, on the upstreamside is provided through the line 327 the hydrogen purifier 321.

The hydrogen purifier 321 is internally separated by a palladium film into the two chambers of the purifying cylinder and the primary chamber. The starting hydrogen feeding line 326 is communicated to the primary chamber outside of the palladium film of the two chambers. In the primary chamber is also provided communicatably the gas release line 326, so as to release a part of the starting hydrogen within the primary chamber. 331 is a heating coil. 323 is the preliminary heating chamber of the starting hydrogen, and the starting hydrogen can be heated by the heating coil 332. The gas feeding system up to this step, the evacuation system represented by 307 and the reaction chamber constitute collectively the CVD apparatus.

It is preferably to design the hydrogen purifier 321 assembled in the main body of CVD apparatus and make the length of the pipeline from the purifying cylinder 330 to the CVD reaction chamber 312 1.5 m or less.

Of course, the bonding portion of the pipeline and the valve are suppressed minimum as required.

Such CVD apparatus is placed in a clean room and the bomb 324 housing the starting hydrogen is arranged outside of the clean room. Both are connected to each other communicatably with the gasline 325. These pipelines are made of SUS subjected to electrolytic polishing.

The starting gases are fed by use of the apparatus as described above in the following manner. The hydrogen fed from the bomb 324 through the line 325 of 10 m or longer to the preliminary heater 323 is heated here to about 400° C. The starting hydrogen heated is purified by the palladium heated to about 420° C. That is, within the purifying cylinder 330 exists hydrogen with a purity of 99.99995% or more, and in the primary chamber hydrogen with higher impurity concentration. Here, an adequate amount of hydrogen is released through the release line 326 so that the impurity concentration in hydrogen may not become higher.

The purified hydrogen is cooled by the cooler 320, of which a part is directly delivered to the mixer 304, and a part fed as the hydrogen for bubbling to the bubbler 305.

DESCRIPTION OF METAL FILM FORMING METHOD (2)

Referring to FIG. 2 and FIG. 4, another embodiment of the metal film forming method of the present invention is described in detail.

As described in the above description (1), a substrate to be deposited as shown in FIG. 2 A is prepared. The substrate is placed in the CVD reaction chamber shown by 12 in FIG. 4, and an alkylaluminum hydride gas and hydrogen are introduced through the gas introducing line 19.

By maintaining the temperature of the substrate at 260° C. to 440° C., more preferably at 270° C. to 440° C., Al is deposited selectively within the openings (FIG. 2 B).

Next, the substrate having Al selectively deposited is moved under the state shielded from the outer air into the etching chamber shown by 13 in FIG. 4, and its surface is lightly etched. Similarly, under the state shielded from the outer air, the substrate is moved to the reaction chamber 14 and a metal film is deposited on the whole substrate surface by the sputtering method, etc. (FIG. 2 C).

The Al deposited within the openings according to the method as described above assumes a monocrystalline structure, having excellent characteristics such as:

(1) reduced generation probability of hillock;
(2) reduced generation probability of alloy spike.

The method as described above is a deposition method excellent in selectivity, and by applying a non-selective deposition method as the next deposition step, and forming a metal film comprising Al as main component also on the Al film selectively deposited as described above and $SiO_2$ which is an insulating film, etc., a metal film suitable for the wiring of a semiconductor device can be obtained.

Similarly for Al-Si, excellent crystalline structure is also exhibited.

Therefore, as the next deposition step, by applying the non-selective deposition method and forming a metal film of Al or comprising Al as main component on the Al-Si film selectively deposited as described above and $SiO_2$ which is an insulating film, etc., a metal film suitable for the wiring of the semiconductor device can be obtained.

Thus, according to the present invention, the interface characteristics of the Al in the openings and the Al on the insulating film can be improved to give a metal film for wiring by which sufficiently low contact resistance can be obtained.

In the following, explanation is made by referring to Examples.

First, Examples 1 to 9 are described, in which a pure Al film is formed selectively and then a metal film comprising Al as main component non-selectively, and the Examples 10 to 16, in which an Al film containing an element such as Si, etc. is selectively formed and then a metal film comprising Al as main component non-selectively are described. Further, the metal film forming method utilizing the apparatus shown in FIGS. 4 to FIG. 7 is described by referring to Examples 17 to 22. Here, Examples 17 to 21 are examples by use of an apparatus in which the direct heating system (FIG. 7) is employed, and Example 22 an example in which an apparatus by use of a resistance heating system (FIG. 4) is utilized.

EXAMPLE 1

First a substrate is prepared. The substrate is a sample having an $SiO_2$ with a thickness of 8000 Å formed by thermal oxidation on an N-type monocrystalline Si wafer. This is performed by patterning of openings with various opening sizes of 0.25 $\mu m \times 0.25$ $\mu m$ square to 100 $\mu m \times 100$ $\mu m$ square on the $SiO_2$, thereby having the subbing Si single crystal exposed. FIG. 2 A schematically shows a part of the substrate. Here, 1 is a monocrystalline silicon substrate as conductor substrate and 2 is a thermally oxidized silicon film as insulating film. This is called Sample 1-1. VH1 and VH2 are openings, having different diameters from each other.

The procedure of forming an Al film on the substrate 1 is as described below.

By use of the apparatus shown in FIG. 1, the reaction chamber 101 is evacuated internally to ca. $1 \times 10^{-8}$ Torr by an evacuation system 107. However, a film of Al can be also formed even if the vacuum degree within the reaction chamber 101 may be worse than $1 \times 10^{-8}$ Torr.

In this Example, DMAH is fed from the first gasline 111. As the carrier gas through the DMAH line, $H_2$ is employed.

$H_2$ is flowed from the second gasline 111A, and the pressure within the reaction chamber 101 is controlled to a predetermined value by controlling the opening degree of the slow leak valve not shown. A typical pressure in this Example is set at ca. 1.5 Torr. Through DMAH line 111 is introduced DMAH into the reaction tube. The total pressure is ca. 1.5 Torr, and DMAH pressure is ca. $5.0 \times 10^{-3}$ Torr. Then, a lamp is lighted to heat directly the wafer. Thus, Al was deposited.

After elapse of a predetermined deposition time, feeding of DMAH is once stopped. The predetermined deposition time of the Al film deposited in this step is the time until the thickness of the Al film on Si (monocrystalline silicon substrate 1) becomes equal to the film thickness of $SiO_2$ (thermally oxidized silicon film 2).

The temperature of the substrate surface by the direct heating at this time is held at 270° C. The above step is called the first deposition step. According to the step up to this, an Al film 3 is deposited selectively within the opening as shown in FIG. 2B.

Next, without breaking vacuum, a wafer is arranged within the sputtering apparatus, and Al is deposited also on the $SiO_2$ film 2 by sputtering. This step is a non-selective deposition step. This is called the second Al film deposition step.

The film forming conditions at this time are as described below. By use of Al as the target, the film is formed by imparting a DC power of 5 to 10 kW in an Ar atmosphere under a pressure of $10^{-1}$ to $10^{-3}$ Torr. The substrate temperature at this time is held at 200° C. by resistance heating.

Figure 2C:
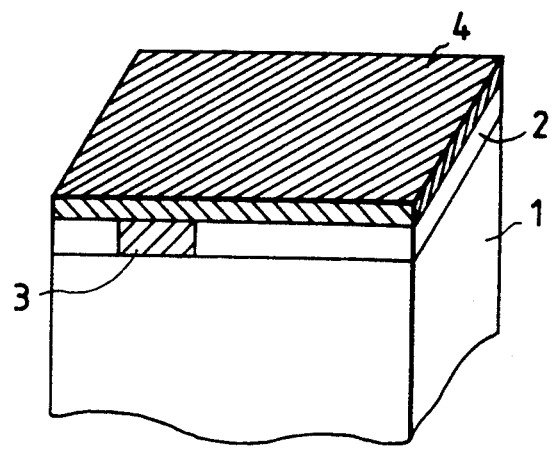

According to the second Al film deposition step, an Al film 4 can be formed on the $SiO_2$ film 2 at a deposition speed of 10000 A as shown in FIG. 2C. An Al film was formed according to the method as described above.

Further, by using again the substrate similarly prepared, but setting for this time the substrate surface temperature at 280° C. to 480° C. by direct heating, an Al film was prepared according to the first deposition step. Here, other film forming conditions in the first deposition step and in the second deposition step were all the same.

Also, Al films were formed by setting the substrate surface temperature at 200° C. to 260° C. and 490° C. to 550° C. during the first deposition step. The results are shown in Table 1.

TABLE 1

| Substrate surface temperature (°C.) | 200 | 230 | 250 | 260 | 270 | 280 | 300 | 350 | 400 | 440 | 450 | 460 | 470 |
|---|---|---|---|---|---|---|---|---|---|---|---|---|---|
| Deposition speed ⊚: 3000~5000 Å/min. ○: 1000~1500 Å/min. | ○ | ○ | ○ | ⊚ | ⊚ | ⊚ | ⊚ | ⊚ | ⊚ | ⊚ | ⊚ | ⊚ | ⊚ |
| Throughput (sheets/hr) ⊚: 15~30 sheets/hr ○: 7~10 sheets/hr | ○ | ○ | ○ | ⊚ | ⊚ | ⊚ | ⊚ | ⊚ | ⊚ | ⊚ | ⊚ | ⊚ | ⊚ |
| Line defect of Si ⊚: None | ⊚ | ⊚ | ⊚ | ⊚ | ⊚ | ⊚ | ⊚ | ⊚ | ⊚ | ⊚ | ⊚ | ⊚ | ⊚ |
| Carbon content ⊚: Detectable limit or less | ⊚ | ⊚ | ⊚ | ⊚ | ⊚ | ⊚ | ⊚ | ⊚ | ⊚ | ⊚ | ⊚ | ⊚ | ⊚ |
| Resistivity ⊚: 2.8~3.4 (μΩcm) ○: 2.7~3.3 (μΩcm) | ○ | ○ | ○ | ⊚ | ⊚ | ⊚ | ⊚ | ⊚ | ⊚ | ⊚ | ⊚ | ⊚ | ⊚ |
| Reflectance ⊚: 90~95% ○: 85~95% Δ: 60% or less | ○ | ○ | ○ | ○ | ⊚ | ⊚ | ⊚ | ⊚ | ⊚ | ⊚ | Δ | Δ | Δ |
| Hillock density of 1μm or more ⊚: 0~10 cm$^{-2}$ ○: 1~10$^2$ cm$^{-2}$ Δ: 10~10$^4$ cm$^{-2}$ | ○ | ○ | ○ | ⊚ | ⊚ | ⊚ | ⊚ | ⊚ | ⊚ | ⊚ | Δ | Δ | Δ |
| Spike generation (breaking probability of 0.15 μm bonding) ⊚: 0% ○: 30% or less | ⊚ | ⊚ | ⊚ | ⊚ | ⊚ | ⊚ | ⊚ | ⊚ | ⊚ | ⊚ | ○ | ○ | ○ |

As can be seen from Table 1, at substrate surface temperatures ranging from 260° to 440° C. by direct heating, Al was deposited within the openings selectively at a deposition speed of 3000 to 5000 Å/min.

As the result of examination of the characteristics of the Al film within the opening at substrate temperatures ranging from 260° to 440° C., they were found to be good with no carbon contained, a resistivity of 2.8 to 3.4 μΩ.cm, a reflectance of 90 to 95%, a hillock density of 1 μm or more being 0 to 10, substantially no spike generation (breaking probability of 0.15 μm bonding).

Of course, contact with Al film formed thereon by sputtering was found to be good due to good surface characteristics of the Al film therebeneath.

In contrast, at a substrate surface temperature of 200° C. to 250° C., the deposition speed was low as 1000 to 1500 Å/min., whereby out put was also lowered to 7 to 10 sheets/H.

On the other hand, when the substrate surface temperature exceeds 440° C., the reflectance became 60% or less, the hillock density of 1 μm or more 10 to 10$^4$ cm$^{-2}$, the spike generation 0 to 30%, whereby the characteristics of the Al film within the openings were lowered.

Next, according to the method as described above, an Al film was formed on a substrate (sample) having a constitution as described below.

On a monocrystalline silicon as the first substrate surface material, a silicon oxide film was formed as the second substrate surface material according to the CVD method, and then subjected to patterning according to photolithographic steps to have the monocrystalline silicon surface partially exposed.

The thermally oxidized $SiO_2$ film had a thickness of 7000 Å, and the size of the exposed portion of the monocrystalline silicon, namely opening 2.5 μm × 3 μm to 10

μm × 10 μm. Thus, Sample 1-2 was prepared (hereinafter such sample is represented as "CVD SiO$_2$ (hereinafter abbreviated as SiO$_2$)/monocrystalline silicon").

Sample 1-3 is a boron-doped oxide film formed by normal pressure CVD (hereinafter abbreviated as BSG)/monocrystalline silicon, Sample 1-4 a phosphorus-doped oxide film formed by normal pressure CVD (hereinafter abbreviated as PSG)/monocrystalline silicon, Sample 1-5 a phosphorus and boron-doped oxide film formed by normal pressure CVD (hereinafter abbreviated as BSPG)/monocrystalline silicon, Sample 1-6 a nitride film formed by plasma CVD (hereinafter abbreviated as P-SiN)/monocrystalline silicon, Sample 1-7 a thermally nitrided film (hereinafter abbreviated as T-SiN)/monocrystalline silicon, Sample 1-8 a nitrided film formed by low pressure DCVD (hereinafter abbreviated as LP-SiN), and Sample 1-9 a nitrided film formed by an ECR apparatus (hereinafter abbreviated as ECR-SiN)/monocrystalline silicon. Further, according to all the combinations of the first substrate surface material and the second substrate surface material shown below, Samples 1-11 to 1-179 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) were employed. As the second substrate surface material, T-SiO$_2$, SiO$_2$, BSG, PSG, BPSG, P-SiN, T-SiN, LP-SiN, ECR-SiN were employed. For all of the samples as mentioned above, good Al films could be formed.

EXAMPLE 2

Example 2 was carried out by performing the same first Al deposition step as in Example 1 and then forming an Al film on the whole surface by use of the CVD method using trimethylaluminum (TMA) as the second deposition step. As the substrate, one with the same constitution as used in Example 1 (Sample 1-1) was prepared. According to the first Al deposition step as described above, a substrate having Al deposited within the openings was arranged within the CVD apparatus.

As the starting gas, trimethylaluminum (TMA) was used, and an Al film was formed on the whole substrate surface in a mixed atmosphere with TMA and H$_2$ gas.

According to the second deposition step in this Example, the Al film was deposited at a deposition speed of 500 Å/min., which was a film excellent in migration resistance with its resistivity being 3.3 to 3.5 μΩ.cm.

EXAMPLE 3

In Example 3 according to the present invention, an aluminum (Al) film is formed by using the apparatus as shown in FIG. 1, DMAH as the starting gas, hydrogen gas as the reaction gas, and carrying out direct heating of the substrate surface by a halogen lamp.

As the substrate, a monocrystalline silicon wafer covered with SiO$_2$ film having a plurality of openings of 0.25 μm square to 100 μm square similarly as in Example 1 was prepared. For this substrate, the first Al film deposition step according to the CVD method and the second Al-Si film deposition step according to the sputtering method were practiced as described below to form an Al film.

According to the same procedure as in Example 1, DMAH and hydrogen were transported into the reaction chamber 101 for Al deposition.

The conditions of the first Al film forming step were set at a total pressure of 1.5 Torr, a DMAH partial pressure of $1.5 \times 10^{-4}$ Torr, a substrate surface temperature of 270° C.

According to the first Al deposition step as described above, Al was deposited at a deposition speed of 3000 to 5000 Å/min. within the openings of various pore diameters to obtain good selectivity. Next, the substrate was arranged in a sputtering apparatus and Al-Si was deposited to a thickness of 5000 Å on the whole surface including SiO$_2$ and selectively deposited Al. The deposition speed at this time was 10000 Å/min.

Further, according to the same method, by use of the same Samples 1-11 to 1-179 as in Example 1 as the substrate, Al films were formed. In all of the Samples, good Al films could be formed through the first and second deposition steps.

In the above-mentioned experiments, the substrate surface temperature was set to 270° C., but this condition was varied from 200° C. to 550° C. by every 10° C. to form Al films.

The characteristics of the Al films of the respective samples as mentioned above according to the first Al deposition step were similar to those shown in Table 1.

EXAMPLE 4

In Example 4, an Al-Si film is formed on the whole surface by use of the CVD method using TMA as the second deposition step after having performed the first Al deposition step as in Example 1.

As the substrate, one having the same constitution as used in Example 1 (Sample 1-1) was prepared.

A substrate having Al deposited within the openings according to the above-mentioned first Al deposition step was arranged within the CVD apparatus.

By use of Si$_2$H$_6$ and trimethylaluminum (TMA) as the starting gas, and in a mixed atmosphere with hydrogen gas and then, an Al-Si film was deposited on the whole substrate surface.

According to the second deposition step in this Example, the Al-Si film was deposited at a deposition speed of 500 Å/min., which was a film excellent in migration resistance with its resistivity being 3.3 to 3.5 μΩ.cm.

EXAMPLE 5

In Example 5, an Al-Cu film is formed on the whole substrate surface by sputtering as the second deposition step after having performed the same first Al deposition step as in Example 1. As the substrate, one with the same constitution as used in Example 1 (Sample 1-1) was prepared.

After Al was deposited selectively within the openings according to the first Al deposition step as described above, the substrate was arranged within the sputtering apparatus. The film forming conditions during sputtering are as described below.

As the target, Al-Cu (0.5%) was used and the DC power in an Ar atmosphere of $5 \times 10^{-3}$ Torr was applied at 7 kW.

According to the second deposition step in this Example, the Al-Cu film was deposited at a deposition speed of 10000 Å/min., which was a film excellent in migration resistance with its resistivity being 3.0 to 3.3 $\mu\Omega$.cm.

EXAMPLE 6

In Example 6, an Al-Cu film is formed according to the CVD method by use of TMA and copper bisacetylacetonate $Cu(C_5H_7O_2)_2$ as the second deposition step after having performed the same first Al deposition step as in Example 1.

As the substrate, one with the same constitution as used in Example 1 (Sample 1-1) was prepared.

After selective deposition of Al within the openings according to the first Al deposition step as described above, the substrate was arranged within a CVD apparatus.

As the starting gas, TMA and $Cu(C_5H_7O_2)_2$ as the gas containing Cu were used, and an Al-Cu film was deposited on the whole substrate surface.

According to the second deposition step of this Example, the Al-Cu film was deposited at a deposition speed of 500 Å/min., which was a film excellent in migration resistance with its resistivity being 3.3 to 3.5 $\mu\Omega$.cm.

EXAMPLE 7

In Example 7, an Al-Si-Cu film is formed on the whole substrate surface according to sputtering as the second deposition step after having performed the same first Al deposition step as in Example 1. As the substrate, one with the same constitution as used in Example 1 (Sample 1-1) was prepared.

After selective deposition of Al within the openings according to the first Al deposition step as described above, the substrate was arranged in a sputtering apparatus. The film forming conditions during sputtering are as follows. As the target, Al-Si(0.5%)-Cu(0.5%) was employed, and DC power was applied at 7 kW in Ar atmosphere.

According to the second deposition step in this Example, the Al-Si-Cu film was deposited at a deposition speed of 10000 Å/min., which was a film excellent in migration resistance with its resistivity being 3.0 to 3.3 $\mu\Omega$m.

EXAMPLE 8

Example 8 shows forming an Al-Si-Cu film according to the CVD method by use of TMA, copper bisacetylacetonate $Cu(C_5H_7O_2)_5$, $H_2$ and $Si_2H_6$ as the second deposition step after having performed the same first Al deposition step as in Example 1.

As the substrate, one with the same constitution as used in Example 1 (Sample 1-1) was prepared. After selective deposition of Al within the openings according to the first Al deposition step as described above, the substrate was arranged within a CVD apparatus. As the starting gas, $Si_2H_6$ as the gas containing Si, TMA and $Cu(C_5H_7O_2)_2$ as the gas containing Cu were used, and an Al-Si-Cu film deposited on the whole substrate surface.

According to the second deposition step of this Example, the Al-Si-Cu film was deposited at a deposition speed of 500 Å/min., which was a film excellent in migration resistance with its resistivity being 3.3 to 3.5 $\mu\Omega$.cm.

EXAMPLE 9

Example 9 shows forming an Al-Ti film on the whole substrate surface according to sputtering as the second deposition step after having performed the same first Al deposition step as in Example 1. As the substrate, one with the same constitution as used in Example 1 (Sample 1-1) was prepared.

After selective deposition of Al within the openings according to the first Al deposition step as described above, the substrate was arranged in a sputtering apparatus.

The film forming conditions during sputtering are as follows. As the target, Al-Ti(0.5%) was employed, and DC power was made 7 kW in Ar atmosphere.

According to the second deposition step in this Example, the Al-Ti film was deposited at a deposition speed of 10000 Å/min., which was a film excellent in migration resistance with its resistivity being 3.0 to 3.3 $\mu\Omega$.cm.

Having described about Examples 1 to 9, it is also possible to deposit Al in the first deposition step and Al-Ti according to the CVD method in the second step. It is also possible to deposit Al in the first step and Al-Si-Ti according to the sputtering method or the CVD method in the second step.

COMPARATIVE EXPERIMENTAL EXAMPLE 1

By use of the CVD apparatus shown in FIG. 3, those with the constitutions of the substrates used in Example 1 (Samples 1-1 to 1-179) were prepared, and the experiments which heat the substrate indirectly by resistance heating under wide temperature conditions ranging from 200° C. to 650° C. were conducted.

As the result, although Al with excellent selectivity was deposited within the openings in all the samples, the deposition speed at that time was inferior by about one cipher as 100 to 800 Å/min. as compared with the Examples as described above.

In FIG. 3, 11 is a reaction chamber, 12 a heater, 13 a holder, 14 a mixer, 15 a bubbler, 16 a gas introducing hole, 17 an evacuation system, 18 an evacuation hole, 19 a substrate, 20 a gas introducing line, 21 a gas feeding line for feeding DMAH gas, 21A a gas feeding line for feeding $H_2$ gas and 22 an evacuation line.

In Examples 1 to 9 as described above, since the substrate was directly heated during selective deposition of aluminum on the substrate, there is the effect that a metal film with excellent film characteristics can be formed at high deposition speed.

EXAMPLE 10

First a substrate is prepared. The substrate is a sample having an $SiO_2$ with a thickness of 8000 Å formed by thermal oxidation on an N-type monocrystalline wafer. This is obtained by patterning of openings with various opening sizes of 0.25 $\mu$m×0.25 $\mu$m square to 100 $\mu$m×100 $\mu$m square on the $SiO_2$, thereby having the subbing Si single crystal exposed. FIG. 2 A schematically shows a part of the substrate. Here, 1 is a monocrystalline silicon substrate as conductor substrate, 2 a thermally oxidized silicon film as insulating film. This is called Sample 1-1. VH1 and VH2 are openings, having different diameters from each other.

The procedure of forming an Al-Si film on the substrate 1 is as described below.

By use of the apparatus shown in FIG. 1, the reaction chamber 101 is evacuated internally to ca. $1 \times 10^{-8}$ Torr by an evacuation system 107. However, a film of Al-Si can be also formed even the vacuum degree within the reaction chamber 101 may be higher than $1 \times 10^{-8}$ Torr.

In this Example, DMAH is fed from the first gasline 111, and at the same time $Si_2H_6$ added from the third gasline 115. As the carrier gas through the DMAH line, $H_2$ is employed.

Through the second gasline 111A is flowed $H_2$, and the pressure within the reaction chamber 101 is controlled to a predetermined value by controlling the opening of the slow leak valve not shown. A typical pressure in the this Example is made ca. 1.5 Torr. Through DMAH line 111 is introduced DMAH into the reaction tube. The total pressure is ca. 1.5 Torr, and DMAH partial pressure made ca. $1.5 \times 10^{-4}$ Torr and $Si_2H_6$ partial pressure $2 \times 10^{-6}$ Torr. Then, a lamp is lighted to directly heat the wafer. Thus, Al-Si is deposited.

As the gas containing Si as the second starting gas during formation of the Al-Si film, $Si_2H_6$, $SiH_4$, $Si_3H_8$, $Si(CH_3)_4$, $SiCl_4$, $SiH_2Cl_2$, $SiH_3Cl$ can be employed.

By addition of DMAH, H2 and Si starting gas such as $Si_2H_6$, Al-Si containing 0.5 to 2.0% of Si can be deposited. The reaction tube pressure is 0.05 to 760 Torr, desirably 0.1 to 0.8 Torr, the substrate temperature 260° C. to 440° C., the DMAH partial pressure $1 \times 10^{-5}$-fold to $1.3 \times 10^{-3}$-fold of the pressure within the reaction tube, the $Si_2H_6$ partial pressure within the reaction tube $1 \times 10^{-7}$ to $1 \times 10^{-4}$-fold, whereby Al-Si is deposited.

After elapse of a predetermined deposition time, feeding of DMAH is once stopped. The predetermined deposition time of the Al film deposited in this step is the time until the thickness of the Al-Si film on Si (monocrystalline silicon substrate 1) becomes equal to the film thickness of $SiO_2$ (thermally oxidized silicon film 2).

The temperature of the substrate surface by the direct heating at this time is made 270° C. The above step is called the first deposition step. According to the step up to this, an Al-Si film 3 is deposited selectively within the opening as shown in FIG. 2B.

Next, a wafer is arranged within the sputtering apparatus, and Al-Si is deposited also on the $SiO_2$ film 2. This step is a non-selective deposition step. This is called the second Al-Si film deposition step.

The film forming conditions at this time are as described below. By use of Al-Si as the target, the film is formed by imparting a DC power of 5 to 10 kW in an Ar atmosphere under a pressure of $10^{-1}$ to $10^{-3}$ Torr. The substrate temperature at this time is made 200° C. by resistance heating.

According to the second Al-Si film deposition step, an Al-Si film 4 can be formed on the $SiO_2$ film 2 at a deposition speed of 10000 Å as shown in FIG. 2 (C). An Al-Si film was formed according to the method as described above.

Further, by again using the substrate similarly prepared, but setting for this time the substrate surface temperature at 280° C. to 480° C. by direct heating, an Al-Si film was prepared according to the first deposition step. Here, other film forming conditions in the first deposition step and the film forming conditions in the second deposition step were all made the same.

Also, Al-Si films were formed by setting the substrate surface temperature at 200° C. to 260° C. and 490° C. to 550° C. during the first deposition step. The results were found to be the same as shown previously in Table 1.

As can be seen from Table 1, at substrate surface temperatures ranging from 260° to 440° C. by direct heating, Al-Si was deposited within the openings selectively at a deposition speed of 3000 to 5000 Å/min.

As the result of examination of the characteristics of the Al-Si film within the opening at substrate temperatures ranging from 260° to 440° C., they were found to be good with no carbon contained, a resistivity of 2.8 to 3.4 $\mu\Omega$.cm, a reflectance of 90 to 95%, a hillock density of 1 $\mu$m or higher of 0 to 10, substantially no spike generation (breaking probability of 0.15 $\mu$m bonding).

Of course, contact with Al film formed thereon by sputtering was found to be good due to good surface characteristic of the Al-Si film therebeneath.

In contrast, at a substrate surface temperature of 200° C. to 250° C., the deposition speed was low as 1000 to 1500 Å/min., whereby throughput was also lowered to 7 to 10 sheets/H.

On the other hand, when the substrate surface temperature exceeds 440° C., the reflectance became 60% or less, the hillock density of 1 $\mu$m or more $10-10^4$ cm$^{-2}$, the spike generation 0 to 30%, whereby the characteristics of the Al-Si film within the openings were lowered.

Next, according to the method as described above, an Al-Si film was formed on a substrate (sample) having a constitution as described below.

On a monocrystalline silicon as the first substrate surface material, a silicon oxide film was formed as the second substrate surface material according to the CVD method, and then subjected to patterning according to photolithographic steps to have the monocrystalline silicone surface partially exposed.

The thermally oxidized $SiO_2$ film had a thickness of 7000 Å, and the size of the exposed portion of the monocrystalline silicon, namely opening 2.5 $\mu$m $\times$ 3 $\mu$m to 10 $\mu$m $\times$ 10 $\mu$m. Thus, Sample 1-2 was prepared (hereinafter such sample is represented as "CVD $SiO_2$ (hereinafter abbreviated as $SiO_2$)/monocrystalline silicon").

Sample 1-3 is a boron-doped oxide film formed by normal pressure CVD (hereinafter abbreviated as BSG)/monocrystalline silicon, Sample 1-4 a phosphorus-doped oxide film formed by normal pressure CVD (hereinafter abbreviated as PSG)/monocrystalline silicon, Sample 1-5 a phosphorus and boron-doped oxide film formed by normal pressure CVD (hereinafter abbreviated as BSPG)/monocrystalline silicon, Sample 1-6 a nitride film formed by plasma CVD (hereinafter called P-SiN)/monocrystalline silicon, Sample 1-7 a thermally nitrided film (hereinafter abbreviated as T-SiN)/monocrystalline silicon, Sample 1-8 a nitrided film formed by low pressure DCVD (hereinafter abbreviated as LP-SiN/monocrystalline silicon), and Sample 1-9 a nitrided film formed by an ECR apparatus (hereinafter abbreviated as ECR-SiN)/monocrystalline silicon. Further, according to all the combinations of the first substrate surface material and the second substrate surface material shown below, Samples 1-11 to 1-179 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) were employed. As the second substrate surface material. T-SiO$_2$, SiO$_2$, BSG, PSG, BPSG, P-SiN, T-SiN, LP-SiN, ECR-SiN were employed. For all of the samples as mentioned above, good Al-Si films could be formed.

EXAMPLE 11

Example 11 was carried out by performing the same first Al-Si deposition step as in Example 10 and then forming an Al-Si film on the whole surface by use of the CVD method using trimethylaluminum (TMA) as the second deposition step. As the substrate, one with the same constitution as used in Example 10 (Sample 1-1) was prepared. According to the first Al-Si deposition step as described above, a substrate having Al-Si deposited with the openings was arranged within the CVD apparatus.

As the starting gas, trimethylaluminum (TMA) was used, and an Al-Si film was formed on the whole substrate surface in a mixed atmosphere with H$_2$ gas.

According to the second deposition step in this Example, the Al-Si film was deposited at a deposition speed of 500 Å/min., which was a film excellent in migration resistance with its resistivity being 3.3 to 3.5 $\mu\Omega$.cm.

EXAMPLE 12

Example 12 shows forming an Al-Cu film on the whole substrate surface by sputtering as the second deposition step after having performed the same first Al-Si deposition step as in Example 10. As the substrate, one with the same constitution as used in Example 10 (Sample 1-1) was prepared.

After Al-Si was deposited selectively within the openings according to the first Al-Si deposition step as described above, the substrate was arranged within the sputtering apparatus. The film forming conditions during sputtering are as described below.

As the target, Al-Cu (0.5%) was used and the DC power in an Ar atmosphere of $5 \times 10^{-3}$ Torr was made 7 kW.

According to the second deposition step in this Example, the Al-Cu film was deposited at a deposition speed of 10000 Å/min., which was a film excellent in migration resistance with its resistivity being 3.0 to 3.3 $\mu\Omega$.cm.

EXAMPLE 13

Example 13 shows forming an Al-Cu film on the whole surface according to the CVD method by use of TMA and copper bisacetylacetonate Cu(C$_5$H$_7$O$_2$)$_2$ as the second deposition step after having performed the same first Al-Si deposition step as in Example 10.

As the substrate, one with the same constitution as used in Example 10 (Sample 1-1) was prepared.

After selective deposition of Al within the openings according to the first Al-Si deposition step as described above, the substrate was arranged within a CVD apparatus.

As the starting gas, TMA and Cu(C$_5$H$_7$O$_2$)$_2$ as the gas containing Cu was used, and an Al-Cu film deposited on the whole substrate surface.

According to the second deposition step of this Example, the Al-Cu film was deposited at a deposition speed of 500 Å/min., which was a film excellent in migration resistance with its resistivity being 3.3 to 3.5 $\mu\Omega$.cm.

EXAMPLE 14

Example 14 shows forming an Al-Si-Cu film on the whole substrate surface according to sputtering as the second deposition step after having performed the same first Al-Si deposition step as in Example 10. As the substrate, one with the same constitution as used in Example 10 (Sample 1-1) was prepared.

After selective deposition of Al-Si within the openings according to the first Al-Si deposition step as described above, the substrate was arranged in a sputtering apparatus. The film forming conditions during sputtering are as follows. As the target, Al-Si(0.5%)-Cu(0.5%) was employed, and DC power was made 7 kW in Ar atmosphere.

According to the second deposition step in this Example, the Al-Si-Cu film was deposited at a deposition speed of 10000 Å/min., which was a film excellent in migration resistance with its resistivity being 3.0 to 3.3 $\mu\Omega$.cm.

EXAMPLE 15

Example 15 shows forming an Al-Si-Cu film according to the CVD method by use of copper bisacetylacetonate Cu(C$_5$H$_7$O$_2$)$_5$, H$_2$ and Si$_2$H$_6$ after having performed the same first Al deposition step as in Example 10.

As the substrate, one with the same constitution as used in Example 10 (Sample 1-1) was prepared. After selective deposition of Al-Si within the openings according to the first Al-Si deposition step as described above, the substrate was arranged within a CVD apparatus. As the starting gas, TMA, Si$_2$H$_6$ as the gas containing Si and Cu(C$_5$H$_7$O$_2$)$_2$ as the gas containing Cu were used, and an Al-Si-Cu film deposited on the whole substrate surface.

According to the second deposition step of this Example, the Al-Si-Cu film was deposited at a deposition speed of 500 Å/min., which was a film excellent in migration resistance with its resistivity being 3.3 to 3.5 $\mu\Omega$.cm.

EXAMPLE 16

Example 16 shows forming an Al-Ti film on the whole substrate surface according to sputtering as the second deposition step after having performed the same first Al-Si deposition step as in Example 10. As the substrate, one with the same constitution as used in Example 10 (Sample 1-1) was prepared.

After selective deposition of Al-Si within the openings according to the first Al-Si deposition step as described above, the substrate was arranged in a sputtering apparatus.

The film forming conditions during sputtering are as follows. As the target, Al-Ti(0.5%) was employed, and DC power was made 7 kW in Ar atmosphere.

According to the second deposition step in this Example, the Al-Ti film was deposited at a deposition speed of 10000 Å/min., which was a film excellent in migration resistance with its resistivity being 3.0 to 3.3 $\mu\Omega$.cm.

Having described above Examples 10 to 16, it is also possible to deposit Al-Si in the first deposition step and Al-Ti according to the CVD method in the second step. It is also possible to deposit Al-Si in the first step and Al-Si-Ti according to the sputtering method or the CVD method in the second step.

COMPARATIVE EXPERIMENTAL EXAMPLE 2

By use of the CVD apparatus shown in FIG. 3, those with the constitutions of the substrates used in Example 10 (Samples 1-1 to 1-179) were prepared, and the experiments which heat indirectly by resistance heating under wide temperature condition range from 200° C. to 650° C. were conducted.

As the result, although Al-Si with excellent selectivity was deposited within the openings in all the samples, the deposition speed at that time was inferior by about one cipher as 100 to 800 Å/min. as compared with the Examples as described above.

In FIG. 3, 11 is a reaction chamber, 12 a heater, 13 a holder, 14 a mixer, 15 a bubbler, 16 a gas introducing hole, 17 an evacuation system, 18 an evacuation hole, 19 a substrate, 20 a gas introducing line, 21 a gas feeding line for feeding DMAH gas, 21A a gas feeding line for feeding $H_2$ gas and 22 an evacuation line.

In Examples 10 to 16 as described above, since the substrate was directly heated during selective deposition of aluminum on the substrate, there is the effect that a metal film with excellent film characteristics can be formed at high deposition speed.

EXAMPLE 17

First a substrate is prepared. The substrate is a sample having an $SiO_2$ with a thickness of 8000 Å formed by thermal oxidation on an N-type monocrystalline wafer. This is obtained by patterning of openings with various opening sizes of 0.25 μm × 0.25 μm square to 100 μm × 100 μm square on the $SiO_2$, thereby having the subbing Si single crystal exposed. FIG. 2A schematically shows a part of the substrate. Here, 1 is a monocrystalline silicon substrate as conductor substrate, 2 a thermally oxidized silicon film as insulating film (layer). This is called Sample 1-1. VH1 and VH2 are openings (exposed portions), having different diameters from each other.

The procedure of forming an Al film on the substrate 1 is as described below.

First, the substrate 1 is arranged in a load lock chamber 11. Into the load lock chamber 11 is introduced hydrogen as described above to make the chamber under hydrogen atmosphere. The reaction chamber 12 is evacuated internally to ca. $1 \times 10^{-8}$ Torr by an evacuation system 10.

However, a film of Al can be also formed even the vacuum degree within the reaction chamber 12 may be higher than $1 \times 10^{-8}$ Torr.

DMAH is fed from the gasline not shown. As the carrier gas through the DMAH line, $H_2$ is employed.

The second gasline not shown is provided for $H_2$ as the reaction gas, and the pressure within the reaction chamber 12 is controlled to a predetermined value by controlling the opening of the slow leak valve not shown. A typical pressure in this case is made ca. 1.5 Torr. Through DMAH line is introduced DMAH into the reaction tube. The total pressure is ca. 1.5 Torr, and DMAH partial pressure made ca. $5.0 \times 10^{-3}$ Torr. Then, current is passed through the resistance heat generating member 17 of the substrate holder 18 to heat directly the wafer. Thus, Al is deposited.

After elapse of a predetermined deposition time, feeding of DMAH is once stopped. The predetermined deposition time of the Al film deposited in this step is the time until the thickness of the Al film on Si (monocrystalline silicon substrate 1) becomes equal to the film thickness of $SiO_2$ (thermally oxidized silicon film 2).

The temperature of the substrate surface by the direct heating at this time is made 270° C. The above step is called the first deposition step. According to the step up to this, an Al film 3 is deposited selectively within the opening as shown in FIG. 2 B.

After completion of deposition of the above-mentioned Al, the CVD reaction chamber 12 is evacuated by the evacuation system 10 until reaching a vacuum degree of $5 \times 10^{-3}$ Torr. At the same time, the Rf etching chamber 13 is evacuated to $5 \times 10^{-6}$ Torr or less. After confirmation that the both chambers have reached the above vacuum degree, the gate valve 10 is opened, the substrate moved from the CVD reaction chamber 12 to the Rf etching chamber 13 by use of a conveying means (arm) 27, and the gate valve 10 closed.

When the substrate is conveyed to the Rf etching chamber 13, the Rf etching chamber 13 is evacuated by the evacuation system 10 until reaching a vacuum degree of $10^{-6}$ Torr or less.

Then, argon is fed to the argon feeding line 22 for Rf etching, and the Rf etching chamber 13 is maintained at an argon atmosphere of $10^{-1}$ to $10^{-3}$ Torr. The substrate holder 20 for Rf etching is maintained at 200° C. Rf of 100 W is supplied to the electrode 21 for Rf etching for 60 seconds, whereby discharging of argon occurs within he Rf etching chamber 13 to etch the surface of the substrate with argon ions to remove the surface layer of the CVD deposited film. In this case, the etching depth corresponds to the oxide, and is about 100 Å.

In this description, the surface etching of the CVD deposited film was effected in the Rf etching chamber, but since the surface layer of the CVD film of the substrate conveyed through vacuum contains no oxygen, etc., and therefore no Rf etching may be effected. In that case, the Rf etching chamber 13 functions as the temperature changing chamber for effecting temperature change within a short time, when the temperature difference between the CVD reaction chamber 12 and the sputtering chamber 14 is great.

In the Rf etching chamber 13, after completion of Rf etching, inflow of argon is stopped and argon in the Rf etching chamber 13 is evacuated. After the Rf etching chamber 13 is evacuated to $5 \times 10^{-6}$ Torr and the sputtering chamber 14 to $5 \times 10^{-6}$ Torr or less, the gate valve 10 is opened. Then, the substrate is moved by means of the arm 27 from the Rf etching chamber 13 to the sputtering chamber 14, followed by closing of the gate valve 10.

When the substrate is conveyed into the sputtering chamber 14, the substrate holder 23 is set at 250° C. in an argon atmosphere of $10^{-1}$ to $10^{-3}$ Torr similarly as in the Rf etching chamber 13.

Discharging of argon is effected at a power of DC 7 KW in this Example to shaven the target material Al-Si (0.5%) with argon ions, thereby depositing Al-Si at a deposition speed of 10000 Å/min. on the substrate. This step is the non-selective deposition step.

This step is called the second Al film deposition step.

After the Al film of 5000 Å is deposited on the substrate, inflow of argon and application of DC power are stopped. After the load lock chamber 11 (15) is evacuated to $5 \times 10^{-3}$ Torr or less, the gate valve 10 is opened, and the substrate is moved. After closing of the gate valve 10, $N_2$ gas flows into the load lock chamber 11 (15) until reaching the atmospheric pressure, and the substrate moves passing through the gate valve 10 to the outside of the apparatus.

The film forming conditions in the above-mentioned second Al film deposition step are as described below. By use of Al as the target, the film is formed by imparting a DC power of 5 to 10 kW in an Ar atmosphere under a pressure of $10^{-1}$ to $10^{-3}$ Torr. The substrate temperature at this time is made 200° C. by resistance heating.

According to the second Al film deposition step as described above, an Al film 4 can be formed on the $SiO_2$ film 2 at a deposition speed of 10000 Å as shown in FIG. 2C. An Al film was formed according to the method as described above.

Further, by again using the substrate similarly prepared, but setting for this time the substrate surface temperature at 280° C. to 480° C. by direct heating, an Al film was prepared according to the first deposition step. Here, other film forming conditions in the first deposition step and the film forming conditions in the second deposition step were all made the same.

Also, Al films were formed by setting the substrate surface temperature at 200° C. to 260° C. and 490° C. to 550° C. during the first deposition step. The results were found to be the same as shown previously in Table 1.

As can be seen from Table 1, at substrate surface temperatures ranging from 260° to 440° C. by direct heating, Al was deposited within the openings selectively at a deposition speed of 3000 to 5000 Å/min.

As the result of examination of the characteristics of the Al film within the opening at substrate surface temperatures ranging from 260° to 440° C., there were found to be good with no carbon contained, a resistivity of 2.8 to 3.4 $\mu\Omega.cm$, a reflectance of 90 to 95%, a hillock density of 1 $\mu m$ or higher of 0 to 10, substantially no spike generation (breaking probability of 0.15 $\mu m$ bonding).

Of course, contact with Al film formed thereon by sputtering was found to be good due to good surface characteristic of the Al film therebeneath.

In contrast, at a substrate surface temperature of 200° C. to 250° C., the deposition speed was low as 1000 to 1500 Å/min., whereby output was also lowered to 7 to 10 sheets/H.

On the other hand, when the substrate surface temperature exceeds 440° C., the reflectance became 60% or less, the hillock density of 1 $\mu m$ or more 10 to $10^4$ $cm^{-2}$, the spike generation 0 to 30%, whereby the characteristics of the Al film within the openings were lowered.

Next, according to the method as described above, an Al film was formed on a substrate (sample) having a constitution as described below.

On a monocrystalline silicon as the first substrate surface material, a silicon oxide film was formed as the second substrate surface material according to the CVD method, and then subjected to patterning according to photolithographic steps to have the monocrystalline silicone surface partially exposed.

The thermally oxidized $SiO_2$ film had a thickness of 7000 Å, and the size of the exposed portion of the monocrystalline silicon, namely opening 0.25 $\mu m \times 0.25$ $\mu m$ to 10 $\mu m \times 10$ $\mu m$. Thus, Sample 1-2 was prepared (hereinafter such sample is represented as "CVD $SiO_2$ (hereinafter abbreviated as $SiO_2$)/monocrystalline silicon").

Sample 1-3 is a boron-doped oxide film formed by normal pressure CVD (hereinafter abbreviated as BSG)/monocrystalline silicon.

Sample 1-4 a phosphorus-doped oxide film formed by normal pressure CVD (hereinafter abbreviated as PSG)/monocrystalline silicon, Sample 1-5 a phosphorus and boron-doped oxide film formed by normal pressure CVD (hereinafter abbreviated as BSPG)/monocrystalline silicon, Sample 1-6 a nitride film formed by plasma CVD (hereinafter called P-SiN)/monocrystalline silicon, Sample 1-7 a thermally nitrided film (hereinafter abbreviated as T-SiN)/monocrystalline silicon, Sample 1-8 a nitrided film formed by low pressure DCVD (hereinafter abbreviated as LP-SiN), and Sample 1-9 a nitrided film formed by an ECR apparatus (hereinafter abbreviated as ECR-SiN)/monocrystalline silicon. Further, according to all the combinations of the first substrate surface material and the second substrate surface material shown below, Samples 1-11 to 1-179 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) were employed. As the second substrate surface material, T-$SiO_2$, $SiO_2$, BSG, PSG, BPSG, P-SiN, T-SiN, LP-SiN, ECR-SiN were employed. For all of the samples as mentioned above, good Al films could be formed.

EXAMPLE 18

Example 18 according to the present invention shows forming an Al film by use of the apparatus shown in FIG. 7 using DMAH as the starting gas and hydrogen gas as the reaction gas, and by directly heating the substrate surface by the halogen lamp 30.

As the substrate, similarly as in Example 17, a monocrystalline silicone wafer covered with an $SiO_2$ film having a plurality of various openings of 0.25 $\mu m$ square to 100 $\mu m$ square was prepared. On the substrate was carried out the first Al film deposition step according to the CVD method as described below, the second Al-Si film deposition step according to the sputtering method to form an Al film.

According to the same procedure as in Example 17, DMAH and hydrogen were transported to the CVD reaction chamber 12 for Al deposition.

The conditions of the first Al film forming step were a total pressure of 1.5 Torr, a DMAH partial pressure of $1.5 \times 10^{-4}$ Torr, and a substrate surface temperature of 270° C.

According to the first Al deposition step as described above, Al was deposited at a deposition speed of 3000 to 5000 Å/min. within the opening of various pore diameters, whereby good selectivity could be obtained. Next, by arranging the substrate in the sputtering chamber 14, and Al-Si was deposited to as thickness of 5000 Å on the whole surface containing $SiO_2$ and Al selectively deposited. The deposition speed at this time was 10000 Å/min.

Further, according to the same method, by use of the same Samples 1-11 to 1-179 as in Example 17 as the substrate, Al films were formed. In all of the Samples, good Al films could be formed through the first and second deposition steps.

In the above experiments, the substrate surface temperature was set at 270° C., and Al films were formed by varying this condition from 200° C. to 550° C. by every 10° C.

The characteristics of the Al films according to the first Al deposition step of all the respective Samples were found to be similar to those shown in Table 1.

EXAMPLE 19

Example 19 shows forming an Al-Cu film on the whole substrate surface by sputtering as the second deposition step after having performed the same first Al deposition step as in Example 17. As the substrate, one with the same constitution as used in Example 17 (Sample 1-1) was prepared.

After Al was deposited selectively within the openings according to the first Al deposition step as described above, the substrate was arranged within the sputtering apparatus 14. The film forming conditions during sputtering are as described below.

As the target, Al-Cu (0.5%) was used and the DC power in an Ar atmosphere of $5 \times 10^{-3}$ Torr was made 7 kW.

According to the second deposition step in this Example, the Al-Cu film was deposited at a deposition speed of 10000 Å/min., which was a film excellent in migration resistance with its resistivity being 3.0 to 3.3 $\mu\Omega$.cm.

EXAMPLE 20

In Example 20 an Al-Si-Cu film is formed on the whole substrate surface according to sputtering as the second deposition step after having performed the same first Al deposition step as in Example 17. As the substrate, one with the same constitution as used in Example 17 (Sample 1-1) was prepared.

After selective deposition of Al within the openings according to the first Al-Si deposition step as described above, the substrate was arranged in a sputtering chamber 14. The film forming conditions during sputtering are as follows. As the target, Al-Si(0.5%)-Cu(0.5%) was employed, and DC power was applied at 7 kW in Ar atmosphere.

According to the second deposition step in this Example, the Al-Si-Cu film was deposited at a deposition speed of 10000 Å/min., which was a film excellent in migration resistance with its resistivity being 3.0 to 3.3 $\mu\Omega$.cm.

EXAMPLE 21

In Example 21 an Al-Ti film is formed on the whole substrate surface according to sputtering as the second deposition step after having performed the same first Al deposition step as in Example 17. As the substrate, one with the same constitution as used in Example 17 (Sample 1-1) was prepared.

After selective deposition of Al within the openings according to the first Al deposition step as described above, the substrate was arranged in a sputtering chamber 14.

The film forming conditions during sputtering are as follows. As the target, Al-Ti(0.5%) was employed, sputtering effected in Ar atmosphere and DC power was made 7 kW.

According to the second deposition step in this Example, the Al-Ti film was deposited at a deposition speed of 10000 Å/min., which was a film excellent in migration resistance with its resistivity being 3.0 to 3.3 $\mu\Omega$.cm.

EXAMPLE 22

By use of the metal film continuous forming apparatus shown in FIG. 4, film formation was carried out in the same manner as in Example 17 on the above substrate under the temperature conditions of 200° C. to 650° C. by resistance heating.

As the result, under the temperature conditions by resistance heating of 160° C. to 450° C., a film of good quality with no carbon, a small resistivity of about 3 $\mu\Omega$.cm and high reflectance was obtained More preferably, at 260° C. to 440° C., the deposition speed became higher as 100 to 800 Å/min., and also the wiring life was long. Most preferably, the temperature was 270° C. to 350° C., and within this range, hillock density was extremely small, and also generation probability of alloy spike was low.

Having described above Examples 17 to 22, it is also possible to deposit Al in the first deposition step and Al-Si-Ti in the second step.

In Examples 17 to 22 as described above, since continuous deposition is carried out by depositing a metal film non-selectively without exposing the substrate to outer air after selective deposition of aluminum on the substrate, a metal film with excellent film characteristics such as step coverage, electromigration, etc. can be formed at high deposition speed.

In the following, Examples (23–28) conducted by use of the apparatus shown in the FIG. 4 (resistance heating) and FIG. 7 (direct heating) are shown. Examples 23–27 are conducted by use of the apparatus of more preferable direct heating system (FIG. 7) and Example 28 by use of the apparatus of the resistance heating system (FIG. 4).

EXAMPLE 23

First a substrate is prepared. The substrate is a sample having an SiO$_2$ with a thickness of 8000 Å formed by thermal oxidation on an N-type monocrystalline wafer. This is obtained by patterning of openings with various opening sizes of 0.25 $\mu$m×0.25 $\mu$m square to 100 $\mu$m×100 $\mu$m square on the SiO$_2$, thereby having the subbing Si single crystal exposed. FIG. 2A schematically shows a part of the substrate. Here, 1 is a monocrystalline silicon substrate as conductor substrate, 2 a thermally oxidized silicon film as insulating film (layer). This is called Sample 1-1. VH1 and VH2 are openings (exposed portions), having different diameters from each other.

The procedure of forming an Al-Si film on the substrate 1 is as described below.

First, the substrate 1 is arranged in a load lock chamber 11. Into the load lock chamber 11 is introduced hydrogen as described above to make the chamber under hydrogen atmosphere. The reaction chamber 12 is evacuated internally to ca. $1 \times 10^{-8}$ Torr by an evacuation system 10.

However, a film of Al-Si can be also formed even if the vacuum degree within the reaction chamber 12 is worse than $1 \times 10^{-8}$ Torr.

DMAH and Si$_2$H$_6$ are fed from the gasline not shown. As the carrier gas through the DMAH line, H$_2$ is employed.

The second gasline not shown is used for H$_2$ as the reaction gas, and the pressure within the reaction chamber 12 is controlled to a predetermined value by controlling the opening degree of the slow leak valve not shown. A typical pressure in this case is set at ca. 1.5 Torr. Through DMAH line is introduced DMAH into the reaction tube. The total pressure is ca. 1.5 Torr, DMAH partial pressure is ca. $1.5 \times 10^{-4}$ Torr and $Si_2H_6$ partial pressure $2 \times 10^{-6}$ Torr. Then, a lamp is lighted to heat directly the wafer. Thus, Al-Si is deposited.

As the gas containing Si which is the second starting gas during formation of the Al-Si film, $Si_2H_6$, $SiH_4$, $Si_3H_8$, $Si(CH_3)_4$, $SiCl_4$, $SiH_2Cl_2$, $SiH_3Cl$ can be employed.

By addition of DMAH, $H_2$ and Si starting gas such as $Si_2H_6$, etc., Al-Si containing 0.5 to 2.0% of Si can be deposited. The reaction tube pressure is 0.05 to 760 Torr, desirably 0.1 to 0.8 Torr, the substrate temperature 260° C. to 440° C., the DMAH partial pressure $1 \times 10^{-5}$-fold to $1.3 \times 10^{-3}$-fold of the pressure within the reaction tube, the $Si_2H_6$ partial pressure within the reaction tube $1 \times 10^{-7}$ to $1 \times 10^{-4}$-fold, whereby Al-Si is deposited.

After elapse of a predetermined deposition time, feeding of DMAH is once stopped. The predetermined deposition time of the Al-Si film deposited in this step is the time until the thickness of the Al-Si film on Si (monocrystalline silicon substrate 1) becomes equal to the film thickness of $SiO_2$ (thermally oxidized silicon film 2).

The temperature of the substrate surface by the direct heating at this time is set at 270° C. The above step is called the first deposition step. According to the step up to this, an Al-Si film 3 is deposited selectively within the opening as shown in FIG. 2B.

After completion of deposition of the above-mentioned Al-Si, the CVD reaction chamber 12 is evacuated by the evacuation system 10 until reaching a vacuum degree of $5 \times 10^{-3}$ Torr or less. At the same time, the Rf etching chamber 13 is evacuated to $5 \times 10^{-6}$ Torr or less. After confirmation that the both chambers have reached the above vacuum degree, the gate valve 10 is opened, the substrate moved from the CVD reaction chamber 12 to the Rf etching chamber 13 by use of a conveying means (arm) 27, and the gate valve 10 closed.

When the substrate is conveyed to the Rf etching chamber 13, the Rf etching chamber 13 is evacuated by the evacuation system 10 until reaching a vacuum degree of $10^{-6}$ Torr or less.

Then, argon is fed from the argon feeding line 22 for Rf etching, and the Rf etching chamber 13 is maintained at an argon atmosphere of $10^{-1}$ to $10^{-3}$ Torr. The substrate holder 20 for Rf etching is maintained at 200° C. Rf of 100 W is fed to the electrode 21 for Rf etching is supplied for 60 seconds, whereby discharging of argon occurs within he Rf etching chamber 13 to etch the surface of the substrate with argon ions and remove the surface layer of the CVD deposited film. In this case, the etching depth corresponds to the oxide, and is about 100 Å.

In this description, the surface etching of the CVD deposited film was effected in the Rf etching chamber, but since the surface layer of the CVD film of the substrate conveyed through vacuum contains no oxygen, etc., no Rf etching may be effected. In that case, the Rf etching chamber 13 functions as the temperature changing chamber for effecting temperature change within a short time, when the temperature difference between the CVD reaction chamber 12 and the sputtering chamber 14 is great.

In the Rf etching chamber 13, after completion of Rf etching, inflow of argon is stopped and argon in the Rf etching chamber 13 is evacuated. After the Rf etching chamber 13 is evacuated to $5 \times 10^{-6}$ Torr and the sputtering chamber 14 to $5 \times 10^{-6}$ Torr or less, the gate valve 10 is opened. Then, the substrate is moved by means of the arm 27 from the Rf etching chamber 13 to the sputtering chamber 14, followed by closing of the gate valve 10.

When the substrate is conveyed into the sputtering chamber 14, the substrate holder 23 is set at 250° C. in an argon atmosphere of $10^{-1}$ to $10^{-3}$ Torr similarly as in the Rf etching chamber 13.

Discharging of argon is effected at a power of DC 7 KW in this Example to shaven the target material Al-Si (0.5%) with argon ions, thereby depositing Al-Si at a deposition speed of 10000 Å/min. on the substrate. This step is the non-selective deposition step.

This step is called the second Al film deposition step. After the Al-Si film of 5000 Å is deposited on the substrate, inflow of argon and application of DC power are stopped. After the load lock chamber 11 (15) is evacuated to $5 \times 10^{-3}$ Torr or less, the gate valve 10 is opened, and the substrate is moved. After closing of the gate valve 10, $N_2$ gas flows into the load lock chamber 11 (15) until reaching the atmospheric pressure, and the substrate moves passing through the gate valve 10 to the outside of the apparatus.

The film forming conditions in the above-mentioned second Al film deposition step are as described below. By use of Al-Si as the target, the film is formed by imparting a DC power of 5 to 10 kW in an Ar atmosphere under a pressure of $10^{-1}$ to $10^{-3}$ Torr. The substrate temperature at this time is set at 200° C. by resistance heating.

According to the second metal film deposition step as described above, an Al-Si film 4 can be formed on the $SiO_2$ film 2 at a deposition speed of 10000 Å as shown in FIG. 2C. An Al was deposited according to the method as described above.

Further, by using again the substrate similarly prepared, but setting for this time the substrate surface temperature at 280° C. to 480° C. by direct heating, an Al-Si film was formed according to the first deposition step. Here, other film forming conditions in the first deposition step and in the second depositions step were all the same.

Also, Al-Si films were formed by setting the substrate surface temperature at 200° C. to 260° C. and 490° C. to 550° C. during the first deposition step. The results were found to be the same as shown previously in Table 1.

As can be seen from Table 1, at substrate surface temperatures ranging from 260° to 440° C. by direct heating, Al was deposited within the openings selectively at a deposition speed of 3000 to 5000 Å/min.

As the result of examination of the characteristics of the Al film deposited within the opening at substrate surface temperatures ranging from 260° to 440° C., they were found to be good with no carbon contained, a resistivity of 2.8 to 3.4 $\mu\Omega$.cm, a reflectance of 90 to 95%, a hillock density of 1 $\mu$m or higher being 0 to 10, substantially no spike generation (breaking probability of 0.15 $\mu$m bonding).

Of course, contact with Al-Si film formed thereon by sputtering was found to be good due to good surface characteristics of the Al-Si film therebeneath.

In contrast, at a substrate surface temperature of 200° C. to 250° C., the deposition speed was low as 1000 to 1500 Å/min., whereby throughout was also lowered to 7 to 10 sheets/H.

On the other hand, when the substrate surface temperature exceeds 440° C., the reflectance became 60% or less, the hillock density of 1 μm or more 10 to $10^4$ cm$^{-2}$, the spike generation 0 to 30%, whereby the characteristics of the Al-Si film within the openings were lowered.

Next, according to the method as described above, an Al-Si film was formed on a substrate (sample) having a constitution as described below.

On a monocrystalline silicon as the first substrate surface material, a silicon oxide film was formed as the second substrate surface material according to the CVD method, and then subjected to patterning according to photolithographic steps to have the monocrystalline silicon surface partially exposed.

The thermally oxidized SiO$_2$ film had a thickness of 7000 Å, and the size of the exposed portion of the monocrystalline silicon, namely opening 0.25 μm × 0.25 μm to 10 μm × 10 μm. Thus, Sample 1-2 was prepared (hereinafter such sample is represented as "CVD SiO$_2$ (hereinafter abbreviated as SiO$_2$)/monocrystalline silicon").

Sample 1-3 is a boron-doped oxide film formed by normal pressure CVD (hereinafter abbreviated as BSG)/monocrystalline silicon, Sample 1-4 a phosphorus-doped oxide film formed by normal pressure CVD (hereinafter abbreviated as PSG)/monocrystalline silicon, Sample 1-5 a phosphorus and boron-doped oxide film formed by normal pressure CVD (hereinafter abbreviated as BSPG)/monocrystalline silicon, Sample 1-6 a nitride film formed by plasma CVD (hereinafter called P-SiN)/monocrystalline silicon, Sample 1-7 a thermally nitrided film (hereinafter abbreviated as T-SiN)/monocrystalline silicon, Sample 1-8 a nitrided film formed by low pressure DCVD (hereinafter abbreviated as LP-SiN/single crystalline silicon), and Sample 1-9 a nitrided film formed by an ECR apparatus (hereinafter abbreviated as ECR-SiN)/monocrystalline silicon. Further, according to all the combinations of the first substrate surface material and the second substrate surface material shown below, Samples 1-11 to 1-179 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) were employed. As the second substrate surface material, T-SiO$_2$, SiO$_2$, BSG, PSG, BPSG, P-SiN, T-SiN, LP-SiN, ECR-SiN were employed. For all of the samples as mentioned above, good Al films could be formed.

EXAMPLE 24

Example 24 according to the present invention forms an aluminum-silicon (Al-Si) film by use of the apparatus shown in FIG. 7 using DMAH and Si$_2$H$_6$ as starting gas and hydrogen gas as reaction gas, and by directly heating the substrate surface by the halogen lamp 30.

As the substrate, a monocrystalline silicon wafer covered with an SiO$_2$ film having a plurality of openings of various sizes of 0.25 μm square to 100 μm square was prepared similarly as in Example 23. On the substrate was carried out the first Al-Si film deposition step according to the CVD method as described below, the second Al-Si film deposition step according to the sputtering method to form a metal film.

According to the same procedure as in Example 23, DMAH, Si$_2$H$_6$ and hydrogen were transported to the CVD reaction chamber 12 to effect Al-Si deposition.

The conditions of the first Al-Si film forming step were a total pressure of 1.5 Torr, a DMAH partial pressure of $1.5 \times 10^{-4}$ Torr, and a substrate surface temperature of 270° C.

According to the first Al-Si deposition step as described above, Al-Si was deposited at a deposition speed of 3000 to 5000 Å/min. within the openings of various pore diameters, whereby good selectivity could be obtained. Next, by arranging the substrate in the sputtering chamber 14, and Al-Si was deposited to as thickness of 5000 Å on the whole surface including SiO$_2$ and the Al-Si selectively deposited. The deposition speed at this time was 10000 Å/min.

Further, according to the same method, by use of the same Samples 1-11 to 1-179 as in Example 23 as the substrate, Al-Si films were formed. In all of the samples, good metal films could be formed through the first and the second deposition steps.

In the above experiments, the substrate surface temperature was set at 270° C., and metal Al films were formed by varying this condition from 200°C. to 550° C. by every 10° C.

The characteristics of the Al-Si films according to the first Al-Si deposition step of all the respective samples were found to be similar to those shown in Table 1.

EXAMPLE 25

Example 25 shows forming an Al-Cu film on the whole substrate surface by sputtering as the second deposition step after having performed the same first Al-Si deposition step as in Example 23. As the substrate, one with the same constitution as used in Example 23 (Sample 1-1) was prepared.

After Al-Si was deposited selectively within the openings according to the first Al-Si deposition step as described above, the substrate was arranged within the sputtering chamber 14. The film forming conditions during sputtering are as described below.

As the target, Al-Cu (0.5%) was used and the DC power in Ar atmospher of $5 \times 10^{-3}$ Torr was made 7 kW.

According to the second deposition step in this Example, the Al-Cu film was deposited at a deposition speed of 10000 Å/min., which was a film excellent in migration resistance with its resistivity being 3.0 to 3.3 μΩ·cm.

EXAMPLE 26

Example 26 shows forming an Al-Si-Cu film on the whole substrate surface according to sputtering as the second deposition step after having performed the same first Al-Si deposition step as in Example 23. As the substrate, one with the same constitution as used in Example 23 (Sample 1-1) was prepared.

After selective deposition of Al-Si within the openings according to the first Al-Si deposition step as described above, the substrate was arranged in a sputtering chamber 14. The film forming conditions during sputtering are as follows. As the target, Al-Si(0.5%)-Cu(0.5%) was employed, and the DC power was made 7 kW in Ar atmosphere.

According to the second deposition step in this Example, the Al-Si-Cu film was deposited at a deposition speed of 10000 Å/min., which was a film excellent in migration resistance with its resistivity being 3.0 to 3.3 μΩ.cm.

EXAMPLE 27

Example 27 describes forming an Al-Ti film on the whole substrate surface according to sputtering as the second deposition step after having performed the same first Al-Si deposition step as in Example 23. As the substrate, one with the same constitution as used in Example 23 (Sample 1-1) was prepared.

After selective deposition of Al within the openings according to the first Al-Si deposition step as described above, the substrate was arranged in a sputtering chamber 14.

The film forming conditions during sputtering are as follows. As the target, Al-Ti(0.5%) was employed, sputtering effected in Ar atmosphere and the DC power was made 7 kW.

According to the second deposition step in this Example, the Al-Ti film was deposited at a deposition speed of 10000 Å/min., which was a film excellent in migration resistance with its resistivity being 3.0 to 3.3 μΩ.cm.

EXAMPLE 28

By use of the metal film continuous forming apparatus shown in FIG. 4, film formation was carried out in the same manner as in Example 23 on the above substrate under the temperature conditions of 200° C. to 650° C. by resistance heating.

As the result, under the temperature conditions by resistance heating of 160° C. to 450° C., a film containing no carbon of good quality with a small resistivity of about 3 μΩ.cm and high reflectance was obtained. More preferably, at 260° C. to 440° C., the deposition speed became higher as 100 to 800 Å/min., and also the wiring life was long. Most preferably, the temperature was 270° C. to 350° C., and within this range, hillock density was extremely small, also generation probability of alloy spike was low.

Having described above about Examples 23 to 28, otherwise it is also possible to deposit Al-Si in the first deposition step and to deposit Al-Si-Ti in the second step.

In Examples 23 to 28 as described above, since a metal film is deposited non-selectively without exposing a substrate to outer air successively after selective deposition of aluminum-silicon on the substrate, a metal film with excellent film characteristics such as step coverage, electromigration, etc. can be formed at a high deposition speed.

EXAMPLE 29

Figure 9:
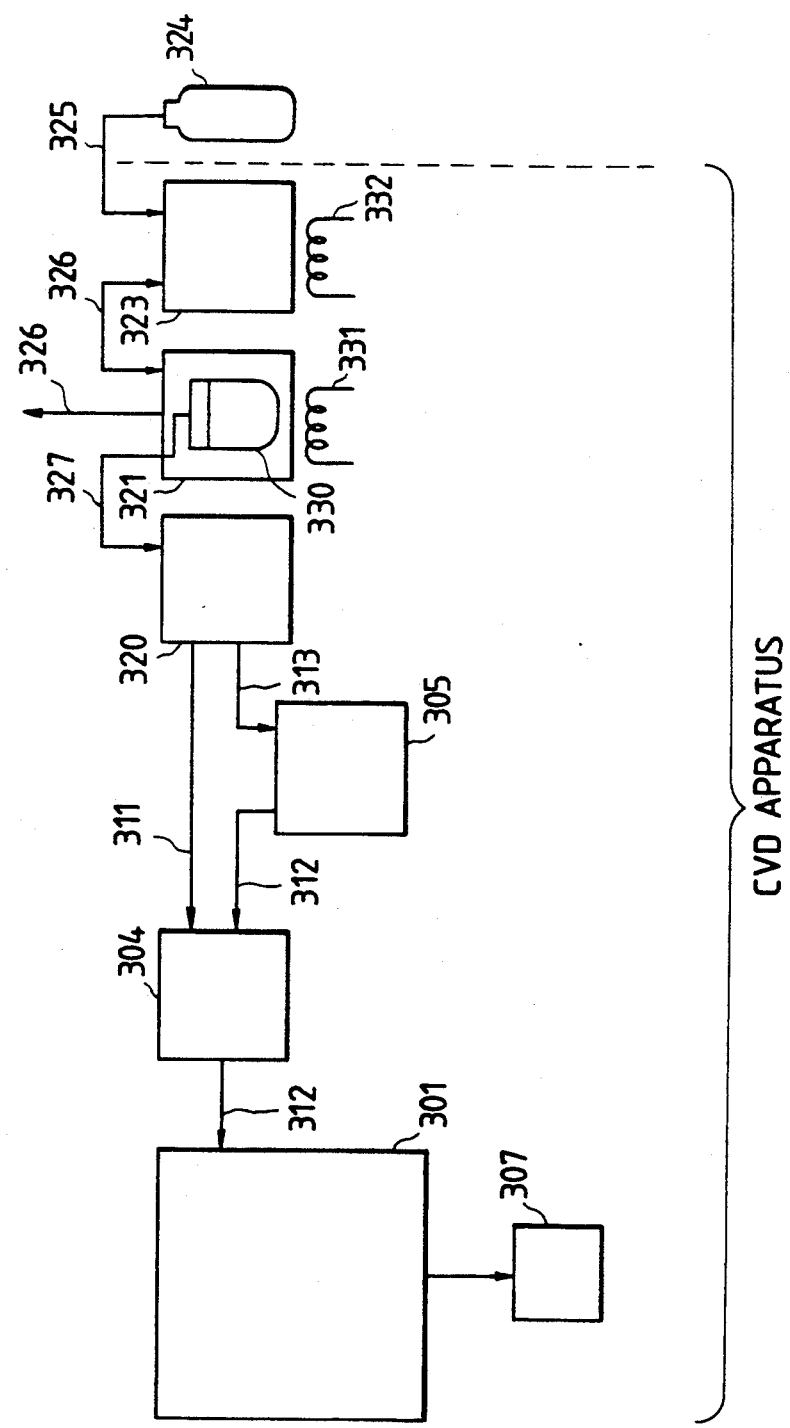
FIG. 9 is a schematic view showing the CVD apparatus to be used preferably in the present invention.

By use of the CVD apparatus equipped with a gas feeding system as shown in FIG. 9, the experiment as described in Example 1 was conducted.

The pipeline length from the purifying cylinder to the CVD reaction chamber was 1.4 m. The amount of the gas leaked between these was found to be $5 \times 10^{-10}$ atm. cc/sec. The purity of hydrogen was 99.99995 to 99.99999 vol. %.

When the samples having Al film formed thereon were observed, the results were basically the same as in Table 1 previously shown, but as the result of the experiment as described below, it has been found that the interplanar distribution of film thickness has become uniform.

By use of an Si wafer of 5 inches as such, samples were prepared in the same procedure as in Example 1.

According to the Al-CVD method, Al was deposited selectively within the openings, and the maximum value and the minimum value of the Al film thickness were measured and the value ($m_{max} - m_{min}$) was divided by the average value m:

$$\frac{(M_{max} - M_{min})}{M} = S$$

As the result, the film thickness distribution S was 2 to 4%.

In view of the fact that the value of S is 5 to 10% when a hydrogen purifier is provided outside of a CVD apparatus at a distance apart of 10 m or longer from a CVD reaction chamber without use of the above-described apparatus, this Example may be considered to be greater in the effect in semiconductor devices where multiple units are taken from a wafer.

What is claimed is:

1. A process for forming a metal film comprising the steps of:
   (i) providing a substrate comprising a semiconductor or a conductor portion and an insulator portion;
   (ii) disposing said substrate in a first film-forming chamber of a metal film-forming apparatus, said film-forming apparatus comprising said first film-forming chamber, a second film-forming chamber for forming a metal film and a substrate conveying path for connecting said first and said second film-forming chambers to each other while being shielded from the atmosphere;
   (iii) selectively forming a first metal film comprising aluminum on said semiconductor or said conductor portion in said first film-forming chamber using an organic aluminum;
   (iv) conveying said substrate on which said first metal film is formed from said first film-forming chamber through said substrate conveying path to said second film-forming chamber and disposing said substrate in said second film-forming chamber, said film-forming apparatus being shielded from the atmosphere during conveying of said substrate; and
   (v) nonselectively forming a second metal film on said substrate in said second film-forming chamber.

2. The process according to claim 1, wherein said first metal is pure aluminum.

3. The process according to claim 1, wherein said first metal further comprises at least one element selected from the group consisting of Si, Ti and Cu.

4. The process according to any one of claims 1 to 3, wherein said second metal film is pure aluminum.

5. The process according to any one of claims 1 to 3, wherein said second metal film is a metal comprising Al and at least one element selected from the group consisting of Si, Ti and Cu.

6. The process according to any one of claims 1 to 3, wherein said second metal film comprises at least one of Cu, W and Mo as main component.

7. The process according to claim 1, wherein said second metal film is formed in said second film-forming chamber by a sputtering method.

8. The process according to claim 1, wherein said second metal film is formed in said second film-forming chamber by a CVD method.

9. The process according to claim 1, wherein said substrate conveying path comprises a gate valve.

10. The process according to claim 1, wherein said substrate conveying path comprises a relaying chamber.

11. The process according to claim 1, wherein said substrate conveying path comprises a cleaning chamber for cleaning the surface of said substrate on which said first metal film is formed.

12. A process for preparing a semiconductor device comprising the steps of:
(i) providing a substrate comprising a semiconductor or a conductor portion and an insulator portion;
(ii) disposing said substrate in a first film-forming chamber of a metal film-forming apparatus, said film-forming apparatus comprising said first film-forming chamber, a second film-forming chamber for forming a metal film and a substrate conveying path for connecting said first and said second film-forming chambers to each other while being shielded from the atmosphere;
(iii) selectively forming a first metal film comprising aluminum on said semiconductor or said conductor portion in said first film-forming chamber using an organic aluminum to electrically connect said semiconductor or said conductor portion to said first metal film;
(iv) conveying said substrate on which said first metal film is formed from said first film-forming chamber through said substrate conveying path to said second film-forming chamber and disposing said substrate in said second film-forming chamber, said film-forming apparatus being shielded from the atmosphere during the conveying of said substrate; and
(v) nonselectively forming a second metal film on said substrate in said second film-forming chamber to electrically connect said first metal film to said second metal film.

* * * * *

UNITED STATES PATENT AND TRADEMARK OFFICE
CERTIFICATE OF CORRECTION

PATENT NO. : 5,151,305
DATED : September 29, 1992
INVENTOR(S) : SHIGEYUKI MATSUMOTO, ET AL.

It is certified that error appears in the above-identified patent and that said Letters Patent is hereby corrected as shown below:

COLUMN 1

Line 29, "opening diameter" should read --opening/diameter--.

COLUMN 2

Line 13, "heated and, thus as" should read --heated. As--.

COLUMN 3

Line 3, "a" (first occurrence) should read --an--.

COLUMN 7

Line 64, "preferably" should read --preferable--.

COLUMN 8

Line 27, "throughput" should read --output--.

COLUMN 11

Line 3, "Al a" should read --Al as a--.
Line 48, "throughput" should read --output--.

COLUMN 12

Line 35, "substate" should read --substrate--.
Line 57, "is" (second occurrence) should be deleted.

UNITED STATES PATENT AND TRADEMARK OFFICE
CERTIFICATE OF CORRECTION

PATENT NO. : 5,151,305
DATED : September 29, 1992
INVENTOR(S) : SHIGEYUKI MATSUMOTO, ET AL.

It is certified that error appears in the above-identified patent and that said Letters Patent is hereby corrected as shown below:

COLUMN 15

Line 32, "heat directly" should read --directly heat--.

COLUMN 16

Line 49, "out put" should read --output--.

COLUMN 20

Line 21, "about" should read --above--.

COLUMN 30

Line 14, "obtained" should read --obtained.--.

COLUMN 31

Line 15, "Si2H6," should read --$Si_2H_6$,--.
Line 55, "he" should read --the--.

COLUMN 32

Line 48, "depositions" should read --deposition--.

COLUMN 33

Line 3, "throughout" should read --output--.

UNITED STATES PATENT AND TRADEMARK OFFICE
CERTIFICATE OF CORRECTION

PATENT NO. : 5,151,305
DATED : September 29, 1992
INVENTOR(S) : SHIGEYUKI MATSUMOTO, ET AL.

Page 3 of 3

It is certified that error appears in the above-identified patent and that said Letters Patent is hereby corrected as shown below:

COLUMN 35

Line 48, "about" should be deleted.
Line 49, "otherwise" should be deleted.

Signed and Sealed this

Thirtieth Day of November, 1993

Attest:

BRUCE LEHMAN

*Attesting Officer*　　　*Commissioner of Patents and Trademarks*